(12) United States Patent
Hsieh et al.

(10) Patent No.: US 12,446,338 B2
(45) Date of Patent: Oct. 14, 2025

(54) METHOD FOR MANUFACTURING IMAGE SENSOR INCLUDING FORMING FinFET TRANSFER GATE HAVING A PLURALITY OF CHANNEL FINS ABOVE A P-TYPE REGION

(71) Applicant: Taiwan Semiconductor Manufacturing Company, Ltd., Hsinchu (TW)

(72) Inventors: Feng-Chien Hsieh, Pingtung (TW); Yun-Wei Cheng, Taipei (TW); Wei-Li Hu, Tainan (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 542 days.

(21) Appl. No.: 17/214,329

(22) Filed: Mar. 26, 2021

(65) Prior Publication Data

US 2022/0310687 A1     Sep. 29, 2022

(51) Int. Cl.
*H01L 27/146* (2006.01)
*H10F 39/00* (2025.01)

(52) U.S. Cl.
CPC ..... *H10F 39/80377* (2025.01); *H10F 39/014* (2025.01); *H10F 39/8033* (2025.01); *H10F 39/802* (2025.01)

(58) Field of Classification Search
CPC ......... H01L 27/14616; H01L 27/14689; H10F 39/014; H10F 39/016
See application file for complete search history.

(56) References Cited

U.S. PATENT DOCUMENTS

| | | | |
|---|---|---|---|
| 7,205,186 B2 * | 4/2007 | Wang | H01L 21/28247 257/E21.057 |
| 11,521,997 B2 * | 12/2022 | Lin | H04N 25/00 |
| 12,183,751 B2 * | 12/2024 | Chen | H10F 39/014 |
| 2005/0167708 A1 * | 8/2005 | Rhodes | H01L 31/03529 257/292 |
| 2006/0084195 A1 * | 4/2006 | Lyu | H01L 27/14603 257/E27.131 |
| 2010/0176460 A1 * | 7/2010 | Goto | H01L 21/823462 257/E27.06 |

(Continued)

*Primary Examiner* — Anh D Mai
(74) *Attorney, Agent, or Firm* — Harrity & Harrity, LLP

(57) ABSTRACT

A pixel sensor includes a transfer fin field effect transistor (finFET) to transfer a photocurrent from a photodiode to a drain region. The transfer finFET includes at least a portion of the photodiode, an extension region associated with the drain region, a plurality of channel fins, and a transfer gate at least partially surrounding the channel fins to control the operation of the transfer finFET. In the transfer finFET, the transfer gate is wrapped around (e.g., at least three sides) of each of the channel fins, which provides a greater surface area over which the transfer gate is enabled to control the transfer of electrons. The greater surface area results in greater control over operation of the finFET, which may reduce switching times of the pixel sensor (which enables faster pixel sensor performance) and may reduce leakage current of the pixel sensor relative to a planar transfer transistor.

20 Claims, 32 Drawing Sheets

(56) References Cited

U.S. PATENT DOCUMENTS

2011/0068394 A1* 3/2011 Sanada .............. H01L 29/7834
257/332
2011/0089513 A1* 4/2011 Endo ................. H01L 21/76237
438/57

* cited by examiner

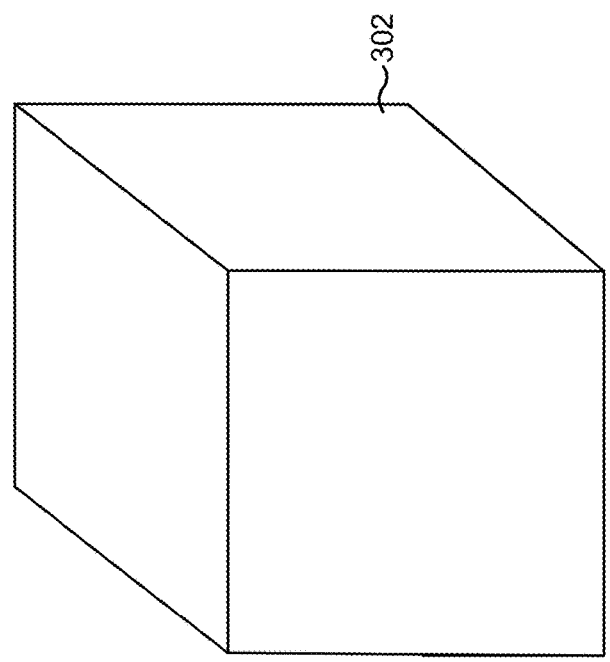

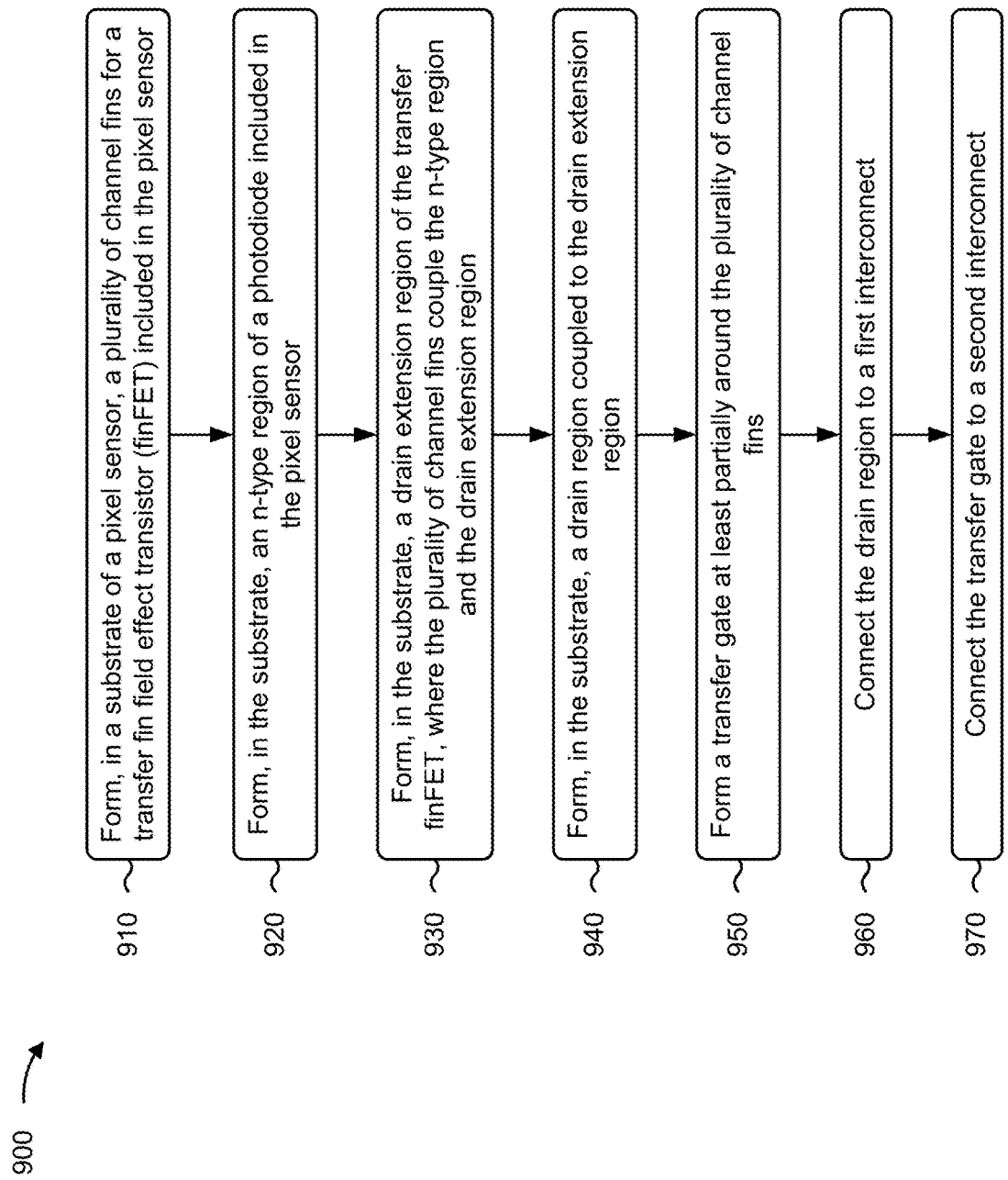

METHOD FOR MANUFACTURING IMAGE SENSOR INCLUDING FORMING FinFET TRANSFER GATE HAVING A PLURALITY OF CHANNEL FINS ABOVE A P-TYPE REGION

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5H are diagrams of an example implementation described herein.

FIG. 9 is a flowchart of an example process relating to forming a pixel sensor.

DETAILED DESCRIPTION

Figure 1:
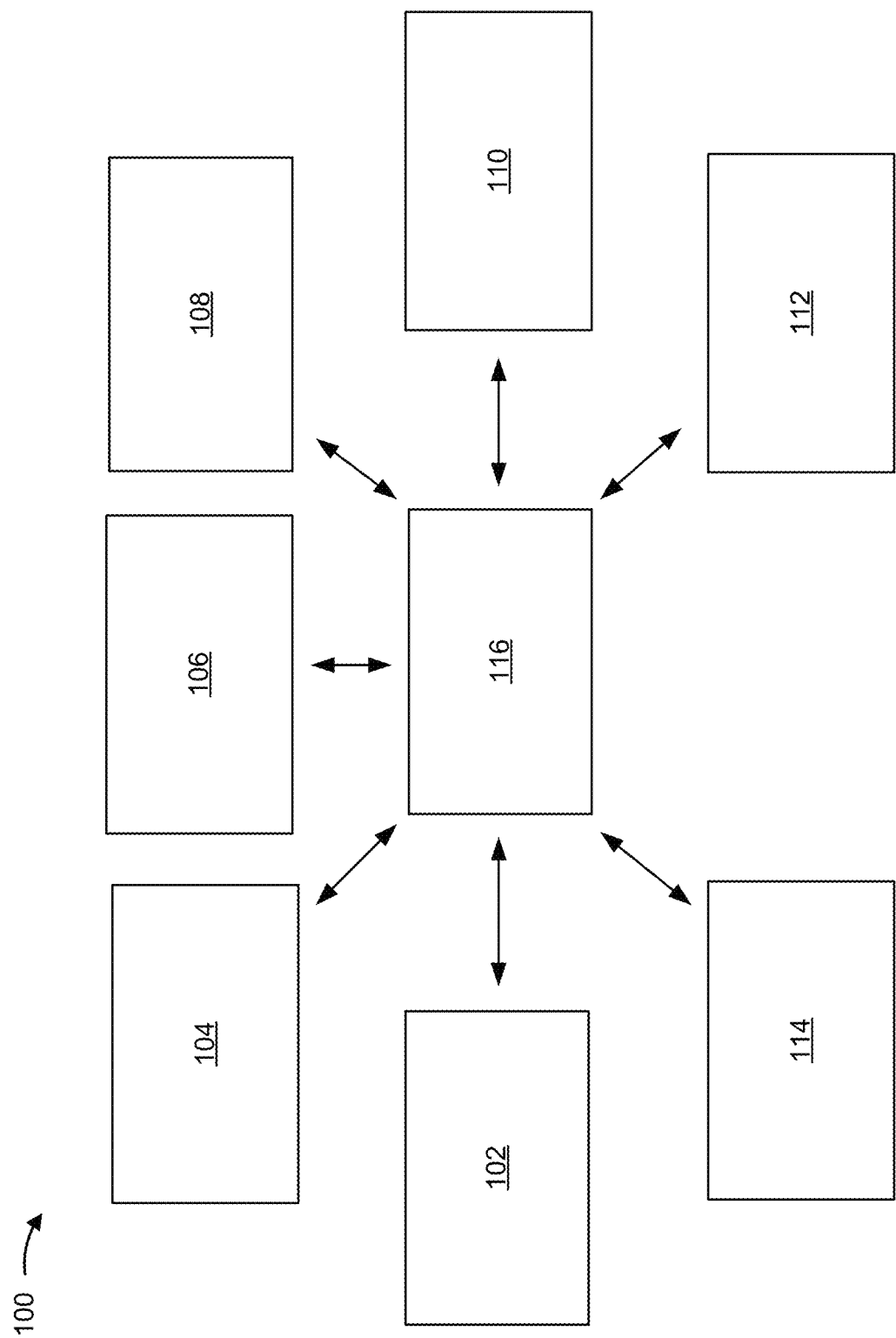
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A pixel sensor may include a planar transfer transistor, in which a photodiode and a drain region of the pixel sensor are separated by a channel region in a substrate, and a planar transfer gate is positioned over the channel to control the operation of the channel. The planar transfer gate may control the transfer of electrons from the photodiode to the drain region through the channel by selectively forming a conductive path through the planar channel (e.g., when the transfer transistor is in an "on" configuration) to permit the flow of electrons through the channel, or removing the conductive path to prevent the flow of electrons through the channel (e.g., when the transfer transistor is in an "off" configuration). As pixel sensor sizes continue to shrink, the ability of a planar transfer gate to control the channel, and to switch between on and off configurations may decrease. In particular, the planar transfer gate may lose the ability to prevent the flow of electrons through the channel (or prevent a leakage current from flowing through the channel) as the length of the planar transfer gate decreases.

Some implementations described herein provide a pixel sensor that includes a transfer fin field effect transistor (finFET). The transfer finFET includes at least a portion of a photodiode of the pixel sensor, an extension region associated with a drain region, a plurality of channel fins, and a transfer gate at least partially surrounding the channel fins to control the operation of the transfer finFET. In the transfer finFET, the transfer gate is wrapped around (e.g., at least three sides) of each of the channel fins, which provides a greater surface area over which the transfer gate is enabled to control the transfer of electrons. The greater surface area results in greater control over operation of the transfer finFET, which may reduce switching times of the pixel sensor (which enables faster pixel sensor performance) and may reduce leakage current of the pixel sensor relative to a planar transfer transistor.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
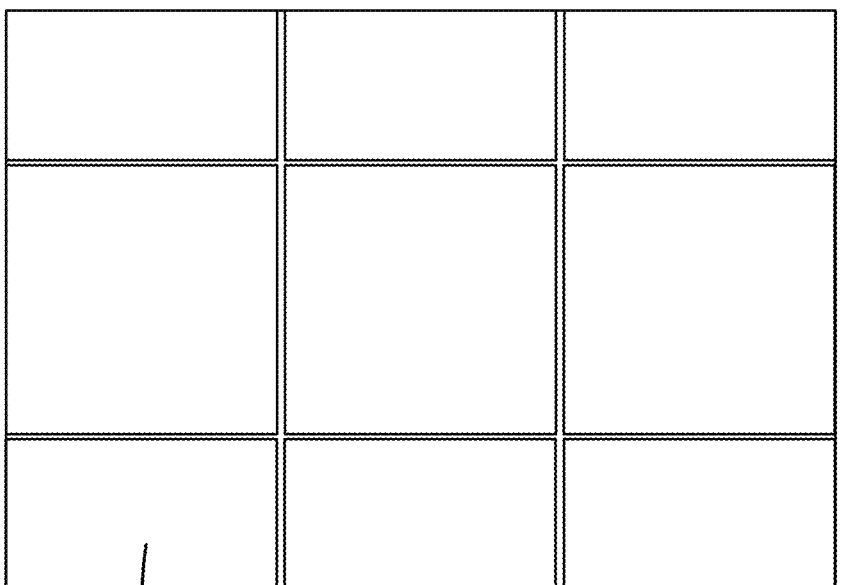
FIG. 2 is a diagram of an example pixel array described herein.

FIG. 2 is a diagram of an example pixel array 200 (or a portion thereof) described herein. The pixel array 200 may be included in an image sensor, such as a complementary metal oxide semiconductor (CMOS) image sensor, a back side illuminated (BSI) CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3A:
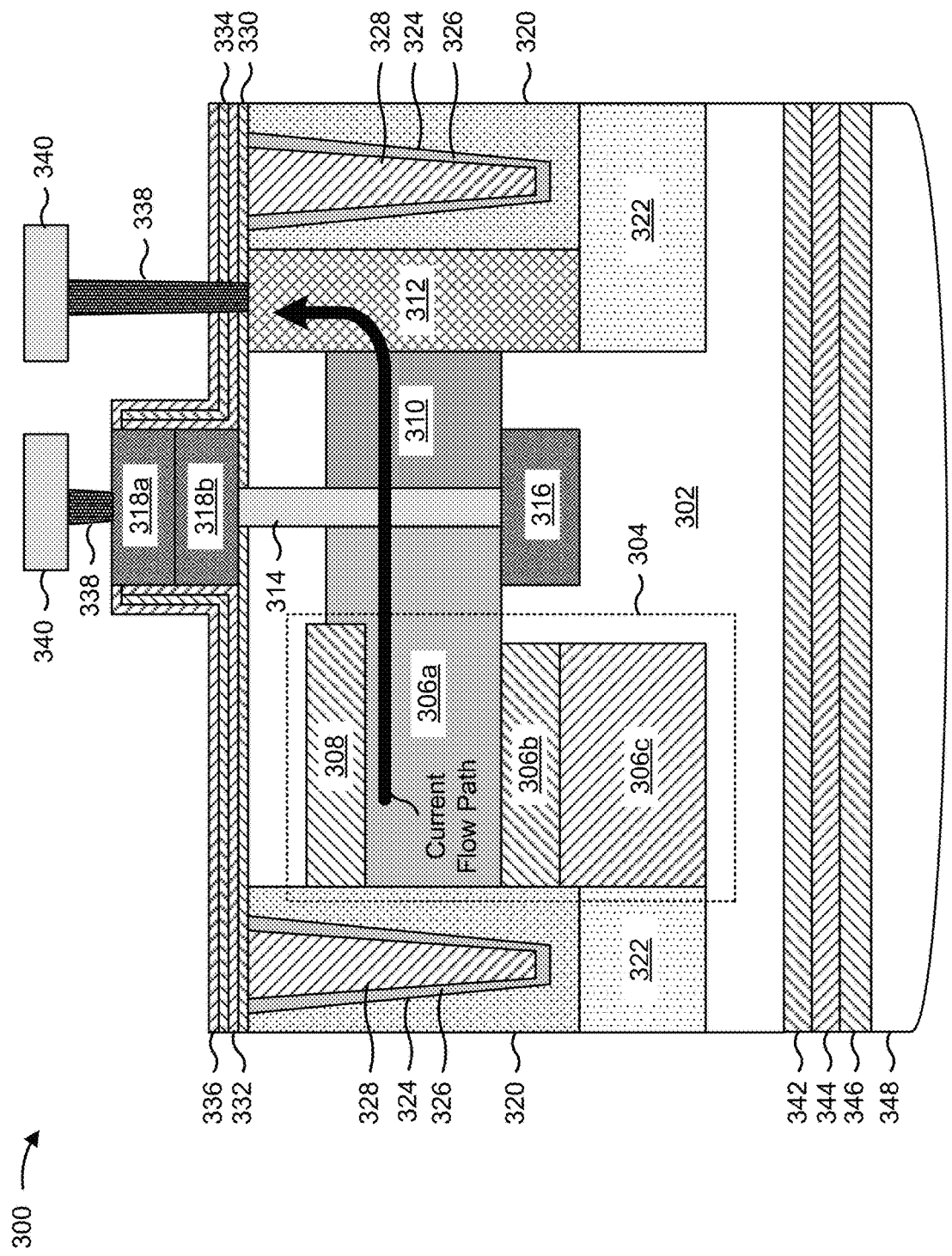
FIGS. 3A-3C are diagrams of an example pixel sensor described herein.
Figure 3B:
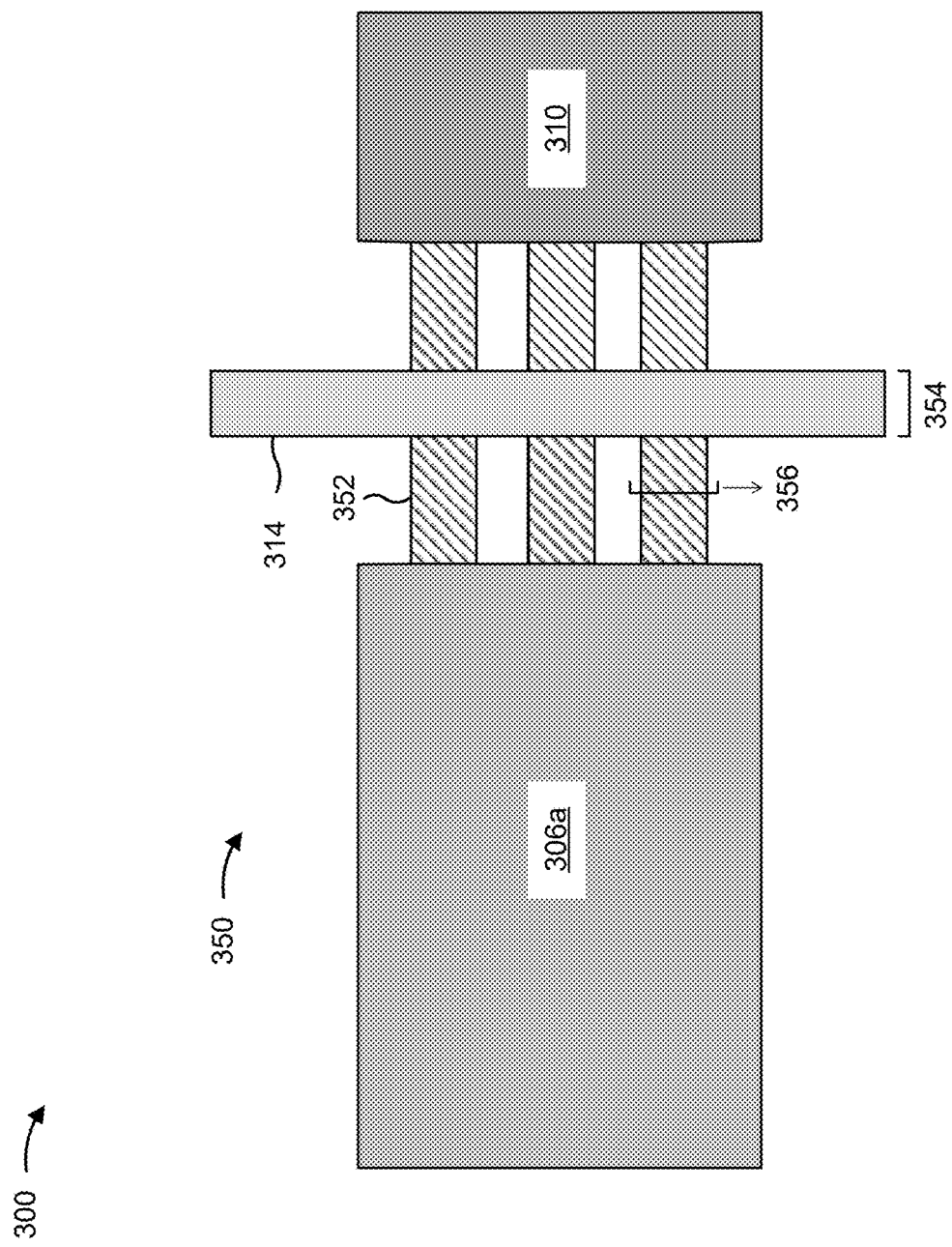
Figure 3C:
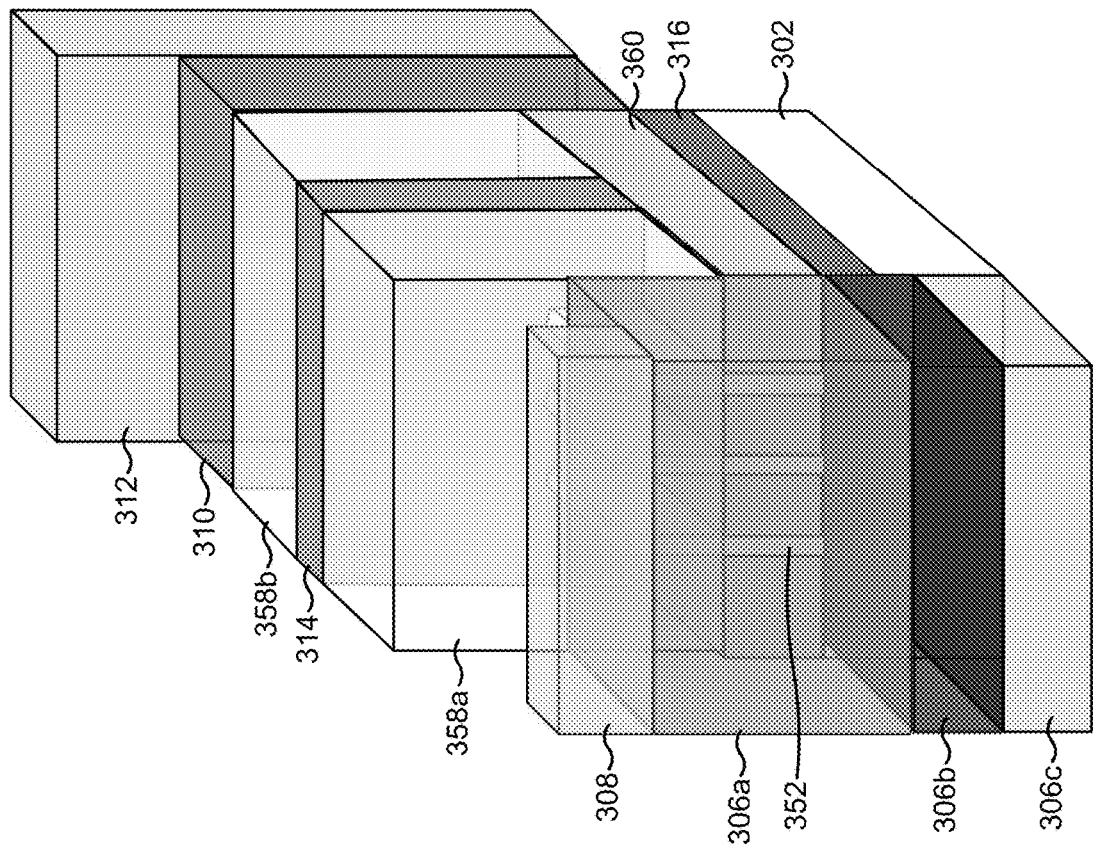

FIGS. 3A-3C are diagrams of an example pixel sensor 300 described herein. The pixel sensor 300 may include a transfer finFET configured to transfer a photocurrent from a photodiode of the pixel sensor 300 to a drain region of the pixel sensor 300. In some implementations, the pixel sensor 300 may be configured as and/or may implement a pixel sensor 202 and be included in the pixel array 200. In some implementations, the pixel sensor 300 may be included in an image sensor. The image sensor may be a CMOS image sensor, a BSI CMOS image sensor, or another type of image sensor.

FIG. 3A illustrates a cross-section view of the pixel sensor 300. As shown in FIG. 3A, the pixel sensor 300 may include a substrate 302. The substrate 302 may include a semiconductor die substrate, a semiconductor wafer, or another type of substrate in which semiconductor pixels may be formed. In some implementations, the substrate 302 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 300 may include a photodiode 304 included in the substrate 302. The photodiode 304 may include a plurality of regions that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type regions 306 of the photodiode 304, and the substrate 302 may be doped with a p-type dopant to form a p-type region 308 of the photodiode 304. The photodiode 304 may be configured to absorb photons of incident light. The absorption of photons causes the photodiode 304 to accumulate a charge (referred to as a photocurrent) due to the photoelectric effect. Photons may bombard the photodiode 304, which causes emission of electrons in the photodiode 304.

The regions included in the photodiode 304 may be stacked and/or vertically arranged. For example, the p-type region 308 may be included over the one or more n-type regions 306. The p-type region 308 may provide noise isolation for the one or more n-type regions 306 and may facilitate photocurrent generation in the photodiode 304. The p-type region 308 (and thus, the photodiode 304) may be spaced away (e.g., downward) from a top surface of the substrate 302 to provide noise isolation and/or light-leakage isolation from one or more upper layers of the pixel sensor 300. The gap between the top surface of the substrate 302 and the p-type region 308 may decrease charging of the pixel sensor 300, may decrease the likelihood of plasma damage to the photodiode 304, and/or may reduce the dark current of the pixel sensor 300 and/or the white pixel performance of the pixel sensor 300, among other examples.

The one or more n-type regions 306 may include an n-type region 306a, an n-type region 306b, and an n-type region 306c. The n-type region 306b may be located over and/or on the n-type region 306c, and the n-type region 306a may be located over and/or on the n-type region 306b. The n-type region 306b and the n-type region 306c may be referred to as deep n-type regions or deep n-wells and may extend the n-type region 306 of the photodiode 304. This may provide an increased area for photon absorption in the photodiode 304. Moreover, at least a subset of the one or more n-type regions 306 may have different doping concentrations. For example, the n-type region 306a may include a greater n-type dopant concentration relative to the n-type region 306b and the n-type region 306c, and the n-type region 306b may include a greater n-type dopant concentration relative to the n-type region 306c. As a result, an n-type dopant gradient is formed, which may increase the migration of electrons upward in the photodiode 304.

The pixel sensor 300 may include a drain extension region 310 and a drain region 312 coupled and/or electrically connected to the drain extension region 310. The drain extension region 310 may be adjacent to the drain region 312. The drain region 312 may include a highly-doped n-type region (e.g., an n$^+$ doped region). The drain extension region 310 may include lightly-doped n-type region(s) that facilitate the transfer of photocurrent from the n-type region 306a to the drain region 312. The drain extension region 310 may be spaced away (e.g., downward) from a top surface of the substrate 302 to provide noise isolation and/or light-leakage isolation from one or more upper layers of the pixel sensor 300. The gap between the top surface of the substrate 302 and the drain extension region 310 may increase noise isolation for the drain extension region 310, may decrease random noise and/or random telegraph noise in the pixel sensor 300, may decrease the likelihood of plasma damage to the drain extension region 310, and/or may reduce the dark current of the pixel sensor 300 and/or the white pixel performance of the pixel sensor 300, among other examples.

The pixel sensor 300 may include a transfer gate 314 to control the transfer of photocurrent between the photodiode 304 and the drain region 312. The transfer gate 314 may be energized (e.g., by applying a voltage or a current to the transfer gate 314) to cause a conductive channel to form between the photodiode 304 and the drain extension region 310. The conductive channel may be removed or closed by de-energizing the transfer gate 314, which blocks and/or prevents the flow of photocurrent between the photodiode 304 and the drain region 312. A p-type region 316 may be included below the transfer gate 314 to provide electrical isolation between the transfer gate 314, the substrate 302, and/or other regions of the pixel sensor 300.

The transfer gate 314 may be coupled and/or electrically connected to a gate electrode stack including an n-doped upper transfer gate electrode region 318a and a transfer gate electrode 318b. The transfer gate electrode 318b may be included over a portion of the top surface of the substrate 302, and the n-doped upper transfer gate electrode region 318a may be located over and/or on the transfer gate electrode 318b. The n-doped upper transfer gate electrode region 318a may include a layer of n+doped polysilicon. The transfer gate electrode 318b may include a layer of polysilicon.

The pixel sensor 300 may include a plurality of regions to provide electrical isolation and/or optical isolation between the pixel sensor 300 and adjacent pixel sensors. The pixel sensor 300 may include a cell p-well region (CPW) 320 and a deep p-well region (DPW) 322 that surround the photodiode 304, the drain extension region 310, the drain region 312, the transfer gate 314, and the p-type region 316. The cell p-well region 320 and the deep p-well region 322 may include a circle or ring shape in a top-down view in the substrate 302. The cell p-well region 320 and the deep p-well region 322 may each include a p+ doped silicon material or another p+ doped material. The cell p-well region 320 may be included over and/or on the deep p-well region 322.

An isolation structure 324 (e.g., a deep trench isolation (DTI) structure, a shallow trench isolation (STI) structure) may be included in the cell p-well region 320. The isolation structure 324 may include one or more trenches that extend downward into the cell p-well region 320 and surround the photodiode 304, the drain extension region 310, the drain region 312, the transfer gate 314, and the p-type region 316. The isolation structure 324 may provide optical isolation between the pixel sensor 300 and one or more adjacent pixel sensors to reduce the amount of optical crosstalk between the pixel sensor 300 and the one or more adjacent pixel sensors. In particular, the isolation structure 324 may absorb, refract, and/or reflect incident light, which may reduce the amount of incident light that travels through a pixel sensor 300 into an adjacent pixel sensor and is absorbed by the adjacent pixel sensor.

A field implant layer (FIL) 326 may be included on the sidewalls and on the bottom surface of the isolation structure 324. The field implant layer 326 may include, for example, silicon germanium, doped silicon, or another type of material that protects other portions of the pixel sensor 300 from damage during formation and/or filling of the isolation structure 324, and/or repairs other portions of the pixel sensor 300 resulting from formation of the isolation structure 324.

An oxide layer 328 may be included in the isolation structure 324 over and/or on the field implant layer 326. The oxide layer 328 may function to reflect incident light toward the photodiode 304 to increase the quantum efficiency of the pixel sensor 300 and to reduce optical crosstalk between the pixel sensor 300 and one or more adjacent pixel sensors. In some implementations, the oxide layer 328 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 328.

A gate dielectric layer 330 may be included above and/or over the top surface of the substrate 302, and above and/or over the cell p-well region 320. The transfer gate electrode 318b may be included over and/or on the gate dielectric layer 330. The gate dielectric layer 330 may include a dielectric material such as tetraethyl orthosilicate (TEOS) or another type of dielectric material. A sidewall oxide layer 332 may be included over and/or the gate dielectric layer 330 on the top surface of the substrate 302. The sidewall oxide layer 332 may also be included on sidewalls of the n-doped upper transfer gate electrode region 318a and/or on sidewalls of the transfer gate electrode 318b. The sidewall oxide layer 332 may include an oxide such as silicon oxide ($SiO_x$) or another type of oxide material. A remote plasma oxide (RPO) layer 334 may be included over and/or on the sidewall oxide layer 332 over the top surface of the substrate 302. The remote plasma oxide layer 334 may also be included over the sidewall oxide layer 332 on the sidewalls of the n-doped upper transfer gate electrode region 318a and/or over the sidewall oxide layer 332 on the sidewalls of the transfer gate electrode 318b. A contact etch stop layer (CESL) 336 may be included over and/or on the remote plasma oxide layer 334 over the top surface of the substrate 302. The contact etch stop layer 336 may also be included over the remote plasma oxide layer 334 on the sidewalls of the n-doped upper transfer gate electrode region 318a and/or over remote plasma oxide layer 334 on the sidewalls of the transfer gate electrode 318b.

The transfer gate 314 and the drain region 312 may be electrically connected by interconnects 338 (e.g., contact plugs, vias, trenches) with a metallization layer 340 above the substrate 302. The metallization layer 340 may be electrically connected to the transfer gate 314 by a first interconnect 338, and to the drain region 312 by a second interconnect 338. The first interconnect layer 338 may be electrically connected with the transfer gate 314 through the n-doped upper transfer gate electrode region 318a and the transfer gate electrode 318b. In some implementations, the interconnects 338 are included in a dielectric layer. The dielectric layer may include an inter-metal dielectric (IMD) layer formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material. The interconnects 338 be filled with a conductive material, such as tungsten, cobalt, ruthenium, and/or another type of conductive material.

FIG. 3A illustrates an example current flow path (e.g., a photocurrent flow path) through the pixel sensor 300. As shown in FIG. 3A, a photocurrent generated by photons of incident light absorbed in the photodiode 304 may originate in the one or more n-type regions 306. A current (or voltage) may be applied to the transfer gate 314 from the metallization layer 340 through an interconnect 338, the n-doped upper transfer gate electrode region 318a, and the transfer gate electrode 318b. The current (or voltage) may energize the transfer gate 314, which causes an electric field to form a conductive channel between the n-type region 306a and the drain extension region 310. The photocurrent may travel along the conductive channel from the n-type region 306a to the drain extension region 310. The photocurrent may travel from the drain extension region 310 to the drain region 312. The photocurrent may be measured through another interconnect 338 at the metallization layer 340.

As described above, the pixel sensor 300 may be included in a BSI CMOS image sensor. Accordingly, the pixel sensor 300 may include one or more layers on a back side or a bottom side of the substrate 302. On the substrate 302, p+ ion layer 342 may be included to increase photon-electron conversion. An antireflective coating (ARC) 344 may be included above and/or on the p+ ion layer 342. The ARC 344 may include a suitable material for reducing a reflection of incident light projected toward the photodiode 304. For example, the ARC 344 may include nitrogen-containing material.

A color filter layer 346 may be included above and/or on the ARC 344. In some implementations, the color filter layer 346 includes a visible light color filter configured to filter a particular wavelength or a particular wavelength range of visible light (e.g., red light, blue light, or green light). In some implementations, the color filter layer 346 includes a near infrared (NIR) filter (e.g., an NIR bandpass filter) configured to permit wavelengths associated with NIR light to pass through the color filter layer 346 and to block other wavelengths of light. In some implementations, the color filter layer 346 includes an NIR cut filter configured to block NIR light from passing through the color filter layer 346. In some implementations, the color filter layer 346 is omitted from the pixel sensor 300 to permit all wavelengths of light to pass through to the photodiode 304. In these examples, the pixel sensor 300 may be configured as a white pixel sensor.

A micro-lens layer 348 may be included above and/or on the color filter layer 346. The micro-lens layer 348 may include a micro-lens for the pixel sensor 300 configured to focus incident light toward the photodiode 304 and/or to reduce optical crosstalk between the pixel sensor 300 and one or more adjacent pixel sensors.

FIG. 3B illustrates a top-down view of a portion of the pixel sensor 300 including the n-type region 306a, the drain extension region 310, and the transfer gate 314. The portion of the pixel sensor 300 includes a transfer transistor of the pixel sensor 300. In particular, the transfer transistor includes a transfer finFET 350 having a fin structure. The fin structure includes a plurality of channel fins 352 between and coupling the n-type region 306a and the drain extension region 310. Each channel fin 352 provides a three-dimensional path through which photocurrent may flow from the n-type region 306a to the drain extension region 310. The transfer gate 314 may control the plurality of channel fins 352 to selectively permit or block the flow of the photocurrent through the channel fins 352. For example, the transfer gate 314 may be energized by a current or a voltage, which may cause the plurality of channel fins 352 to conduct a photocurrent from the n-type region 306a to the drain extension region 310 through the plurality of channel fins 352. When the current or the voltage is removed from the transfer gate 314, the plurality of channel fins 352 may no longer conduct the photocurrent.

As further shown in FIG. 3B, one or more of the structures or components of the transfer finFET 350 may include one or more attributes. For example, the transfer gate 314 may include a length 354 corresponding to a channel length of the transfer finFET 350. The length 354 affects the amount of surface area across which the transfer gate 314 can control the activation and deactivation of a conductive channel in the channel fins 352. The greater the length 354 of the transfer gate 314, the more control that the transfer gate 314 may have over the conductive channel. However, the switching speed of the transfer finFET 350 may decrease as the length 354 of the transfer gate 314 increases (e.g., because the conductive channel is to be formed over a larger surface area). Conversely, the shorter the length 354, the less control the transfer gate 314 may have over the conductive channel (which may result in greater leakage currents) while the switching speed of the transfer finFET 350 may increase. However, the fin structure of the channel fins 352 provides an increased surface area relative to a planar transistor, which enables the transfer finFET 350 to maintain good control and low leakage currents as the length 354 of the transfer gate 314 decreases. The transfer gate 314 may be formed such that the length 354 of the transfer gate 314 satisfies one or more parameters, such as a switching speed parameter, a leakage current parameter, and/or another parameter. As an example, the length 354 of the transfer gate 314 may be approximately less than 16 nanometers.

As another example, a channel fin 352 may include a width 356 corresponding to a width of the channel fin 352. The width 356 may affect the current-carrying capacity of the channel fin 352. The greater the width 356, the greater the amount or magnitude of photocurrent that can be carried by the channel fin 352. Conversely, the smaller the width 356, the lesser the amount or magnitude of photocurrent that can be carried by the channel fin 352. Similarly, another attribute of the channel fins 352 may include a quantity of the channel fins 352 included in the transfer finFET 350. The greater the quantity of the channel fins 352, the greater the amount or magnitude of photocurrent that can be carried by the channel fins 352. The lesser the quantity of the channel fins 352, the lesser the amount or magnitude of photocurrent that can be carried by the channel fin 352. The width 356 and/or the quantity of the channel fins 352 may be configured such that the channel fins 352 satisfy a size parameter for the transfer finFET 350, such that the channel fins 352 satisfy a photocurrent parameter (e.g., a current-carrying capacity), and/or such that the channel fins 352 satisfy another parameter.

FIG. 3C illustrates a three-dimensional perspective view of a portion of the pixel sensor 300. FIG. 3C illustrates the three-dimensional structure and arrangement of a portion of the substrate 302, the one or more n-type regions 306, the p-type region 308, the drain extension region 310, the drain region 312, the transfer gate 314, the p-type region 316, and the plurality of channel fins 352. As further shown in FIG. 3C, the pixel sensor 300 may include a plurality of buffer oxide regions 358, such as a buffer oxide region 358a and a buffer oxide region 358b. The buffer oxide regions 358 may include an oxide material such as a silicon oxide ($SiO_x$) or another type of dielectric material.

The buffer oxide region 358a may be included above and/or over a plurality of isolation regions 360, and between the transfer gate 314 and the n-type region 306a. The buffer oxide region 358a may further at least partially surround the plurality of channel fins 352. The buffer oxide region 358a may provide electrical and/or optical isolation between the transfer gate 314 and the n-type region 306a.

The buffer oxide region 358b may be included above and/or over the plurality of isolation regions 360, and between the transfer gate 314 and the drain extension region 310. The buffer oxide region 358b may further at least partially surround the plurality of channel fins 352. The buffer oxide region 358b may provide electrical and/or optical isolation between the transfer gate 314 and the drain extension region 310.

The plurality of isolation regions 360 may include an oxide material such as a silicon oxide (SiOx) or another type of dielectric material. The plurality of isolation regions 360 may be included over and/or on the p-type region 316, and in between the plurality of channel fins 352. The plurality of isolation regions 360 may provide electrical isolation between the plurality of channel fins 352.

As indicated above, FIGS. 3A-3C are provided as one or more examples. Other examples may differ from what is described with regard to FIGS. 3A-3C.

Figure 4A:
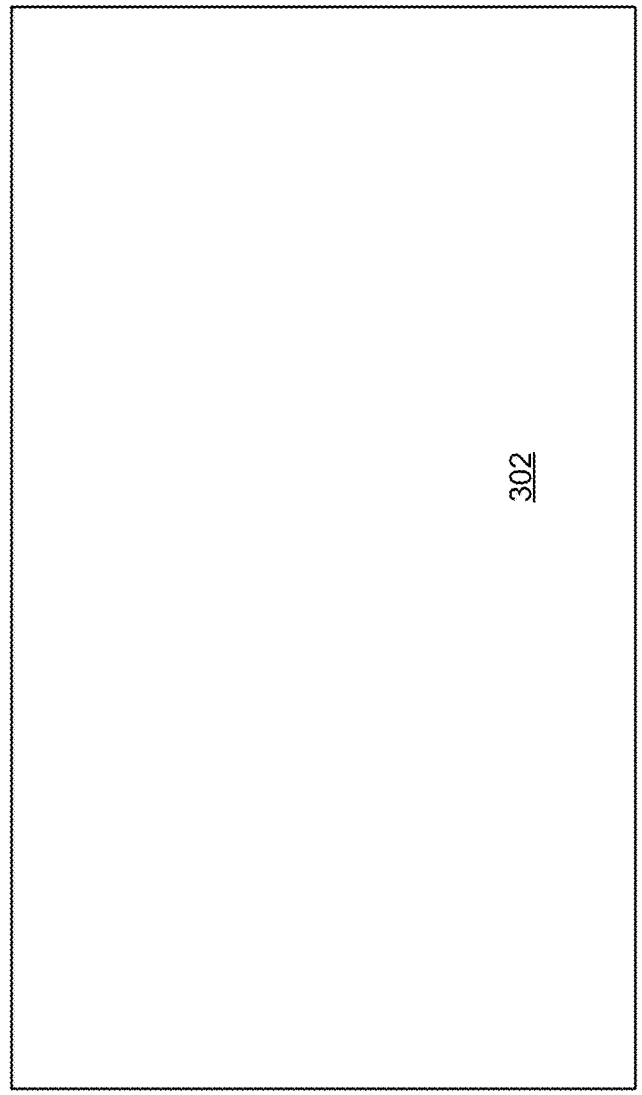
FIGS. 4A-4O are diagrams of an example implementation described herein.
Figure 4A:
Figure 4B:
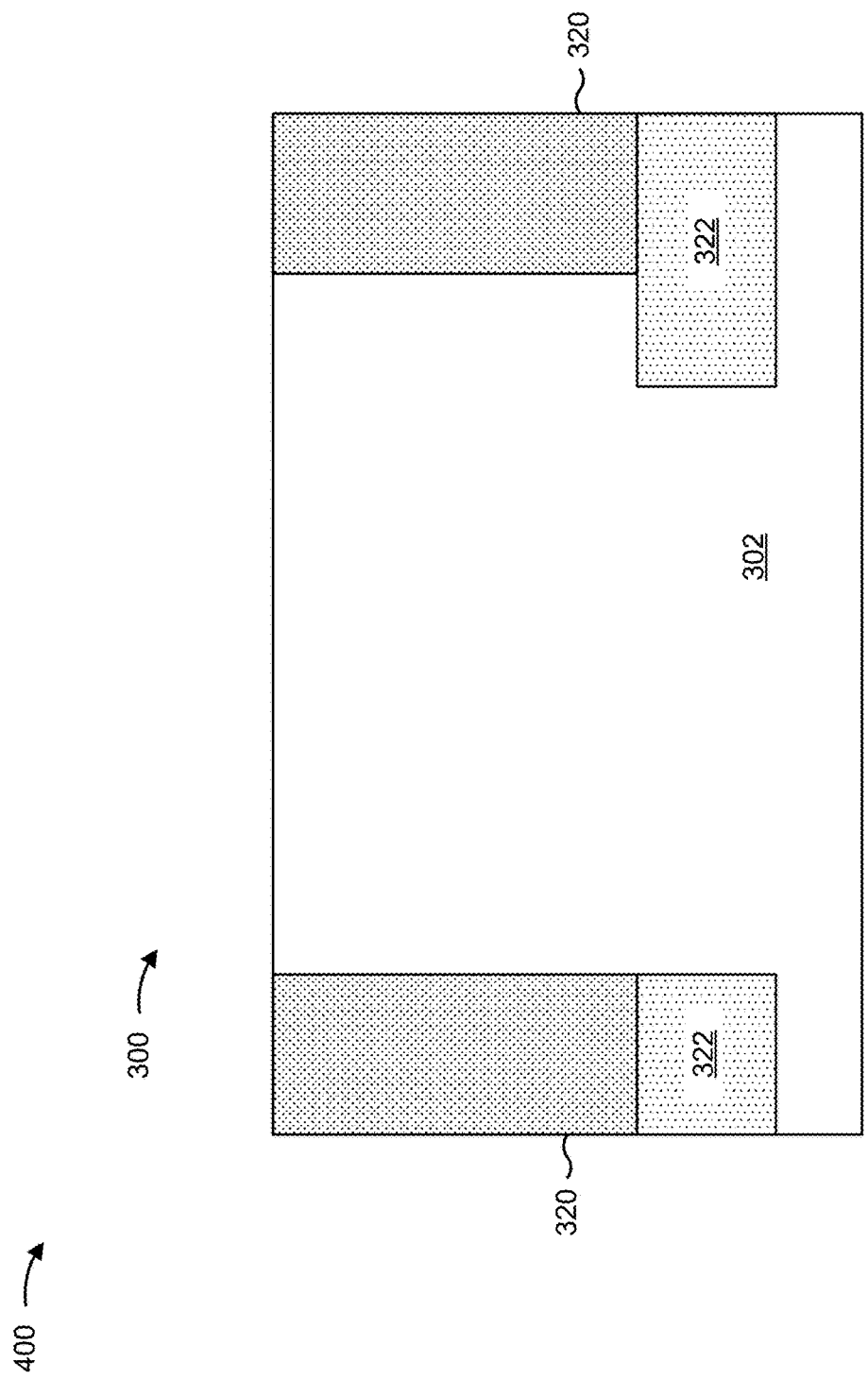
Figure 4C:
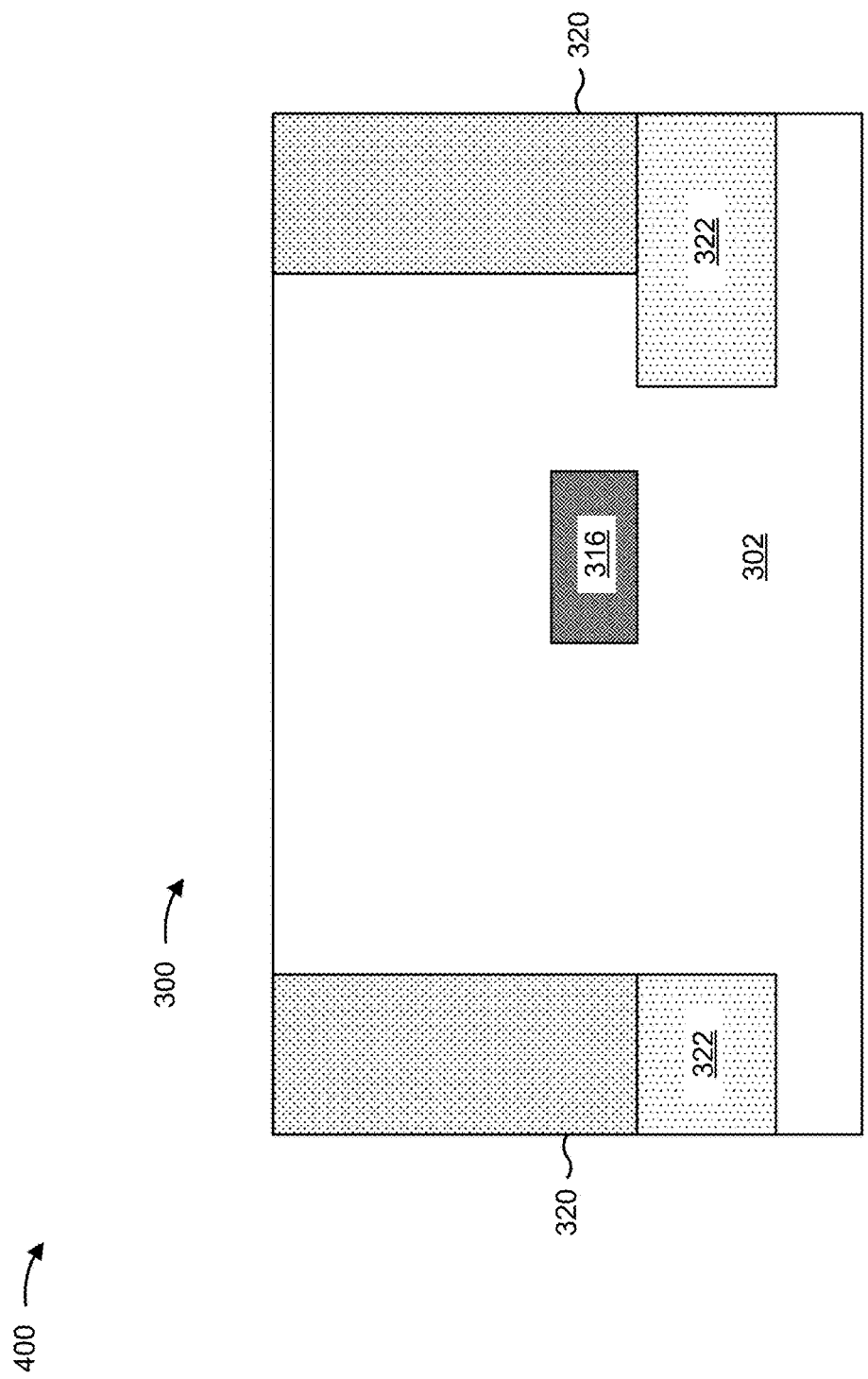
Figure 4D:
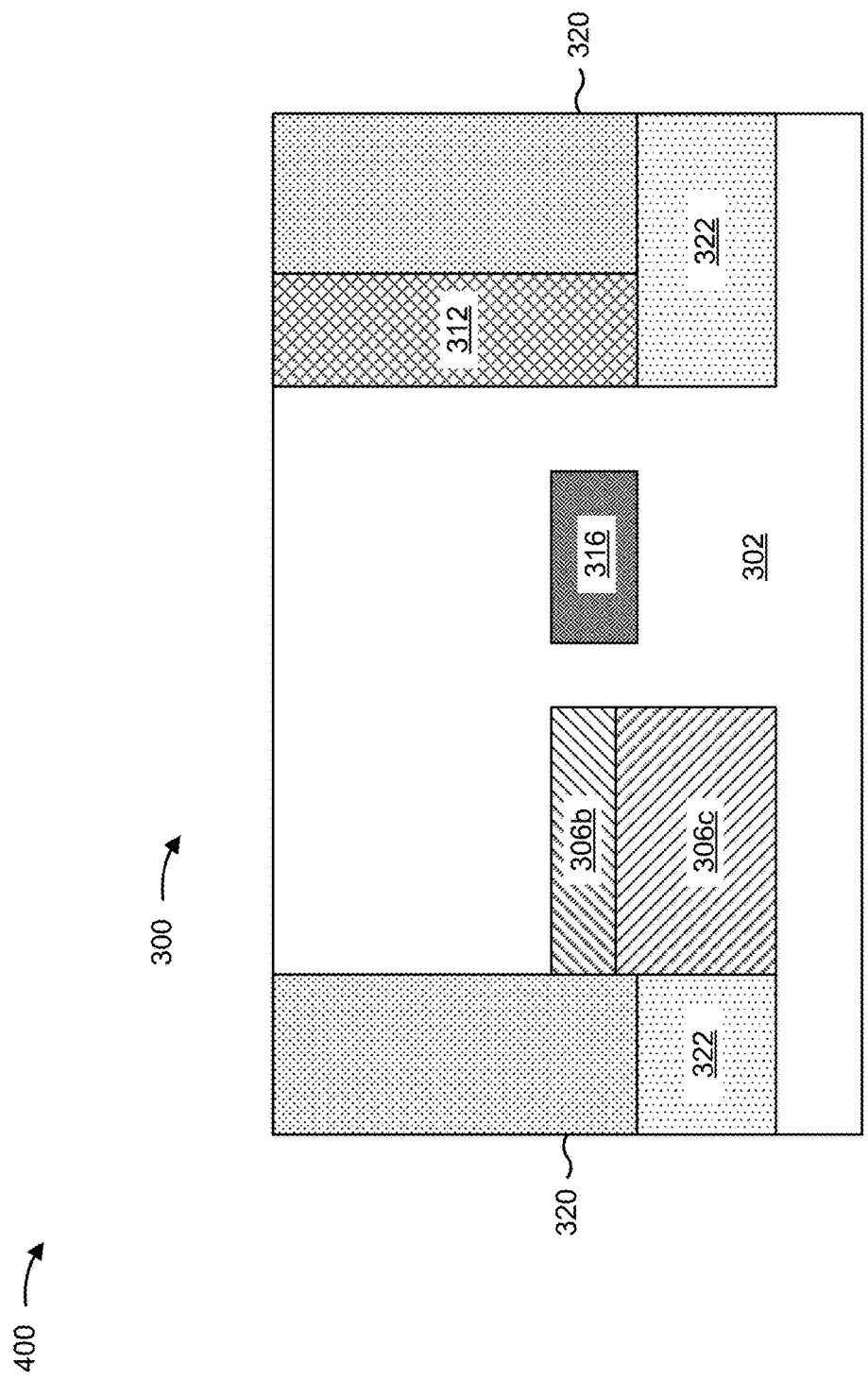
Figure 4E:
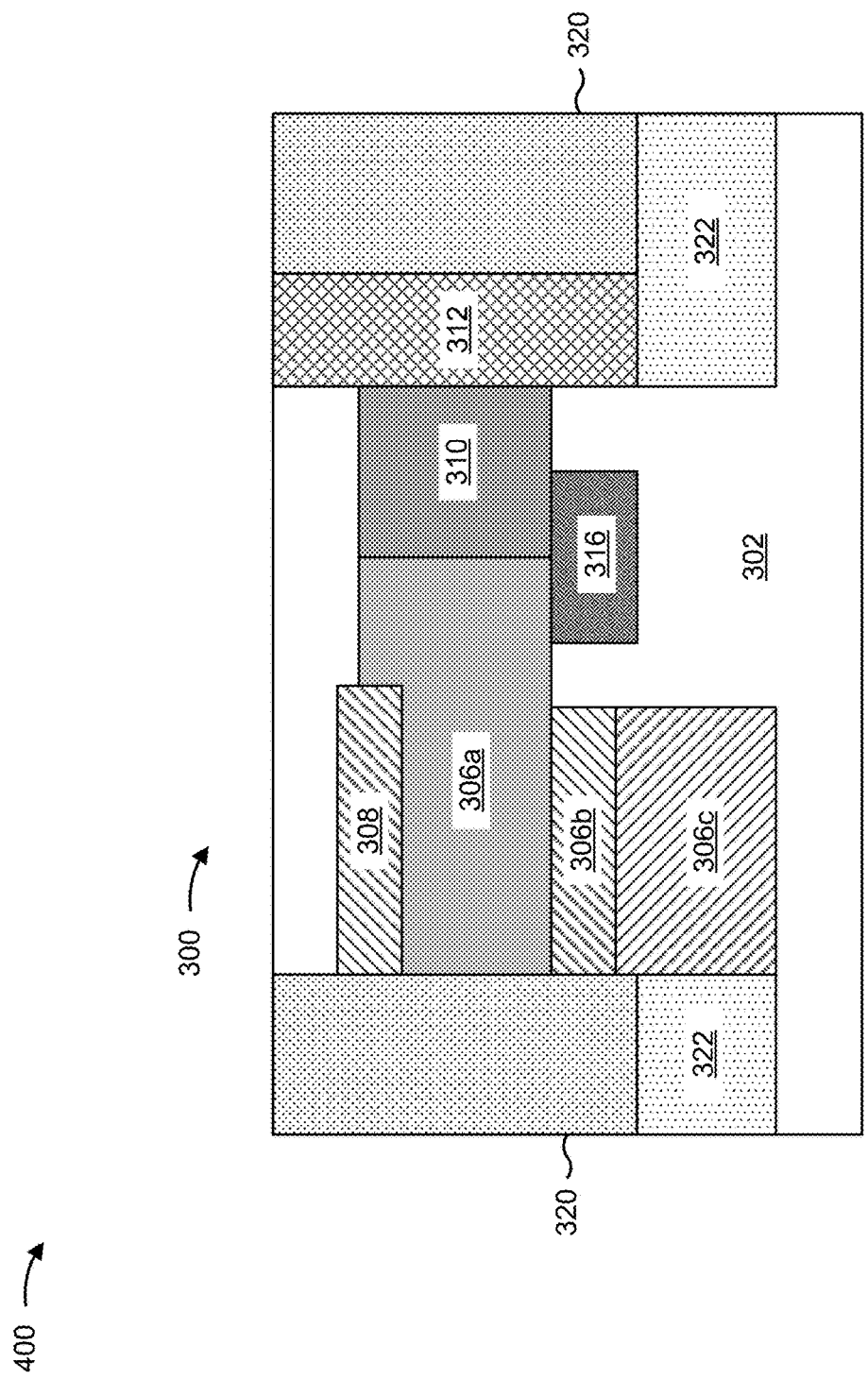
Figure 4F:
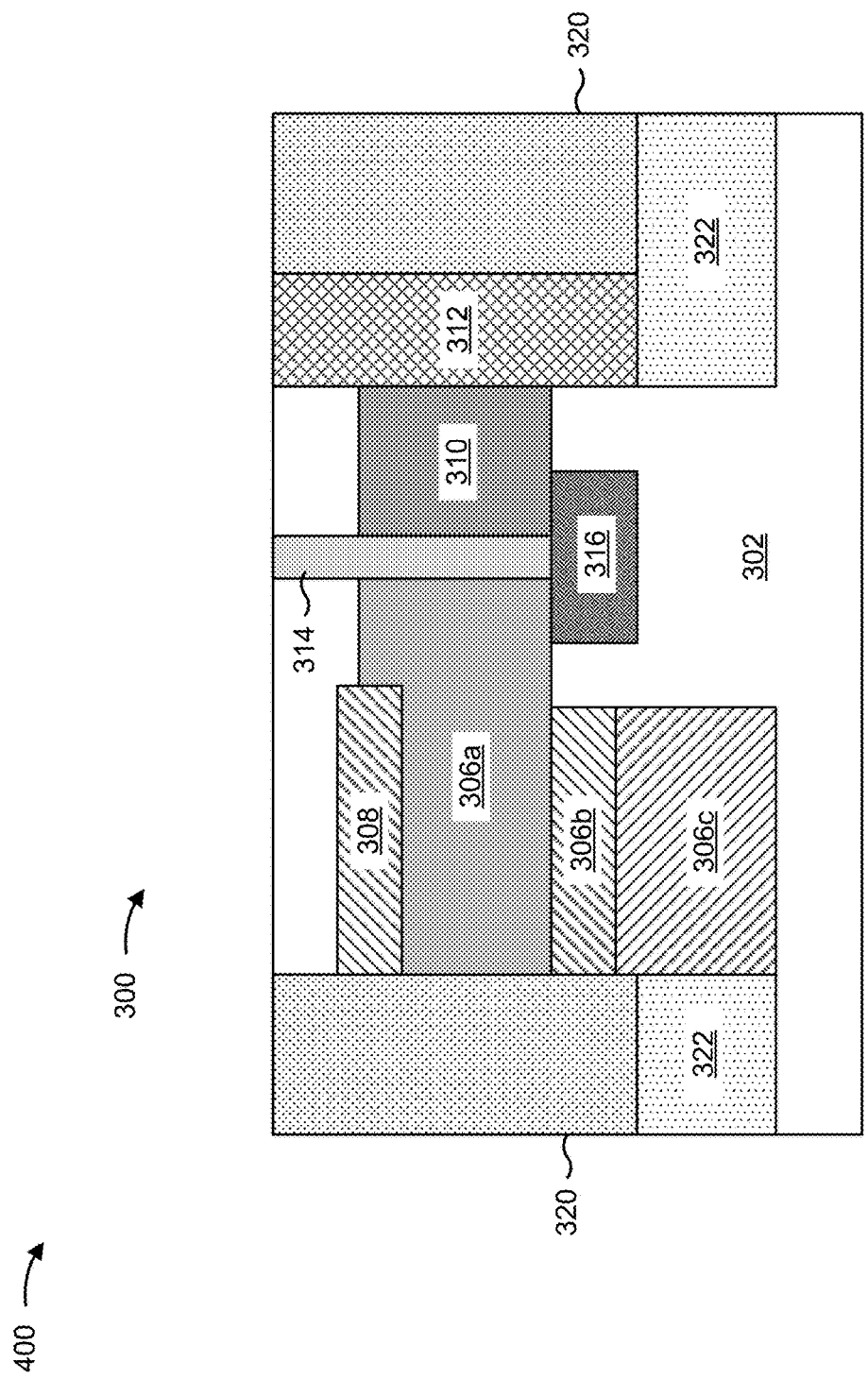
Figure 4G:
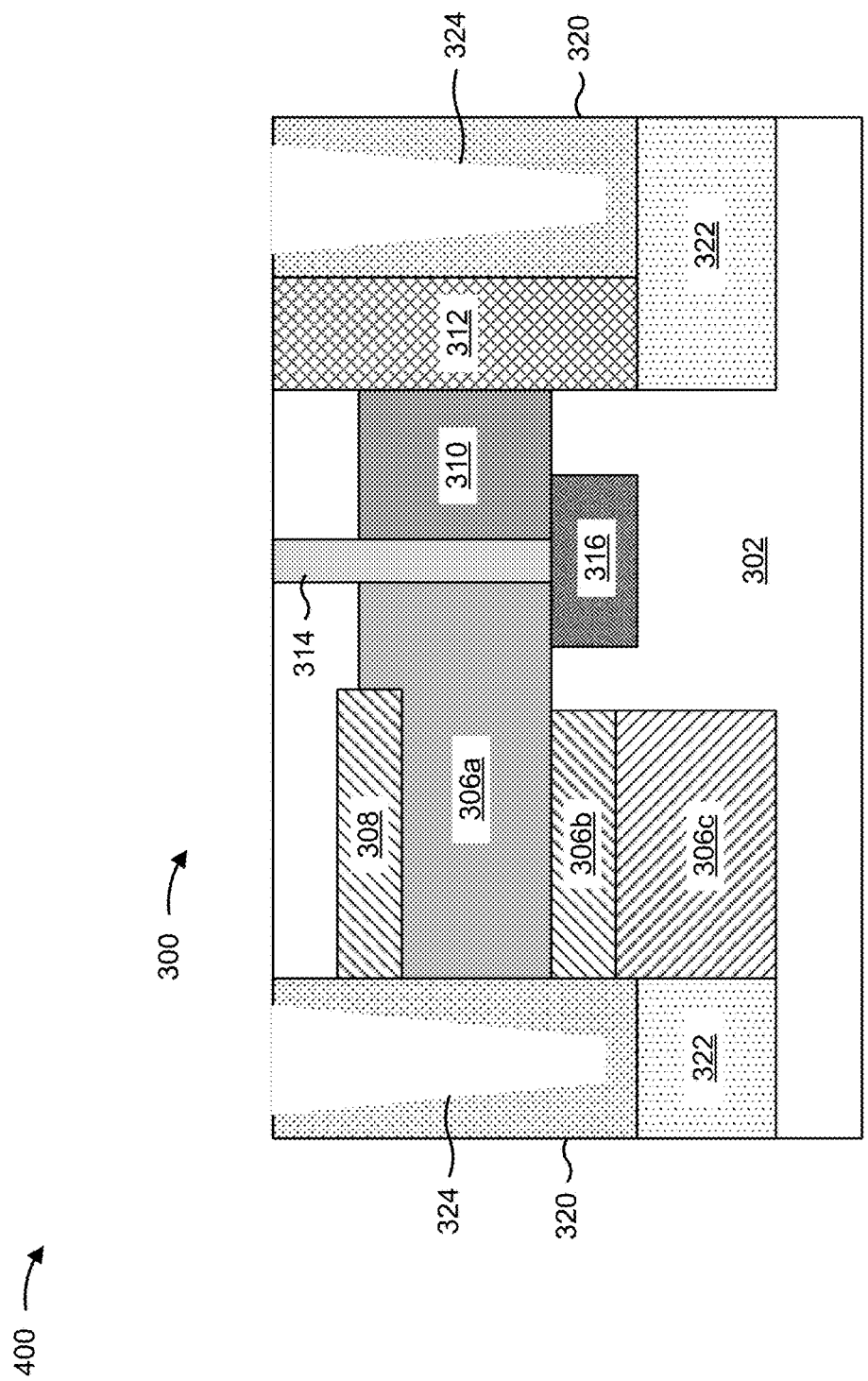
Figure 4H:
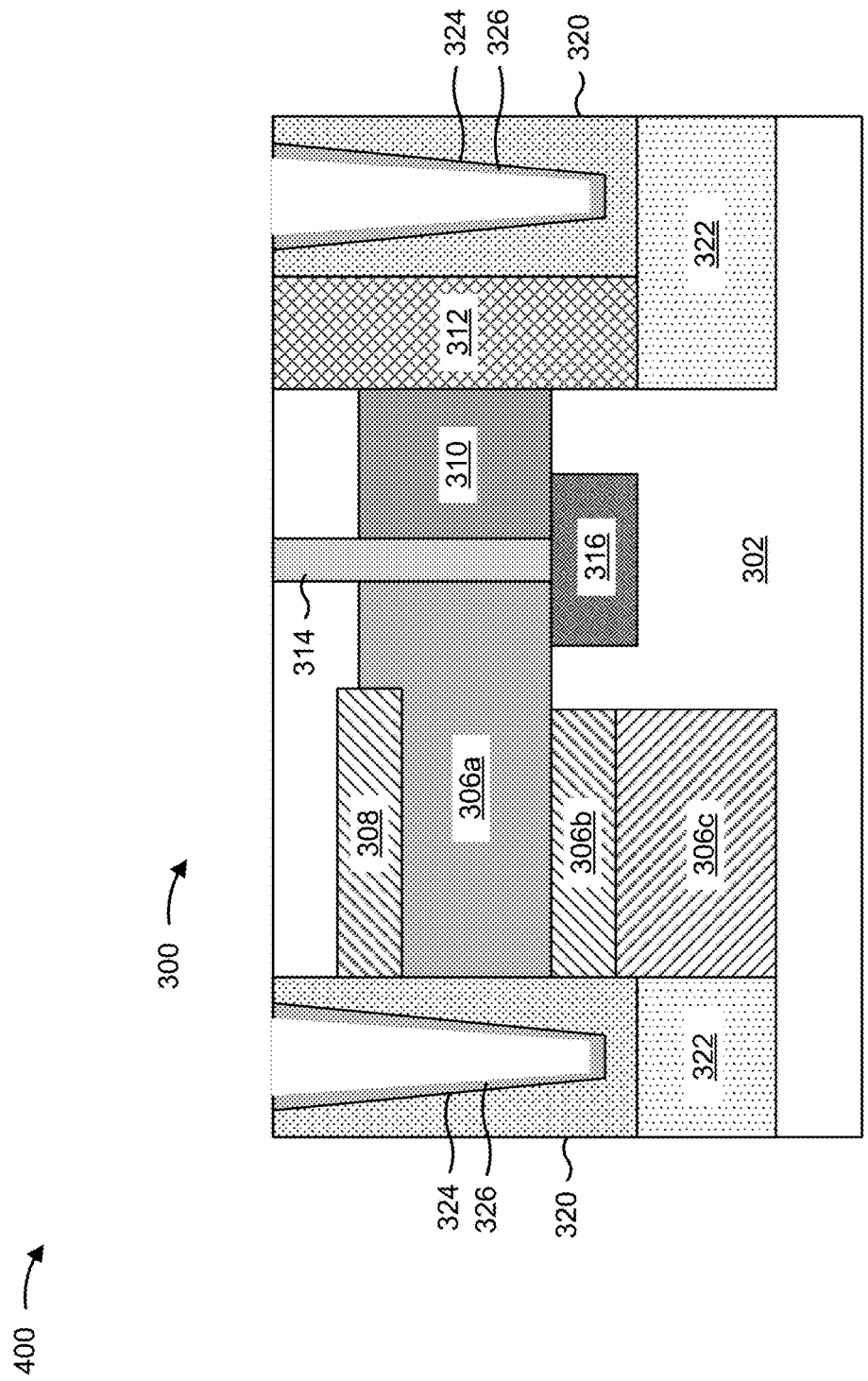
Figure 4I:
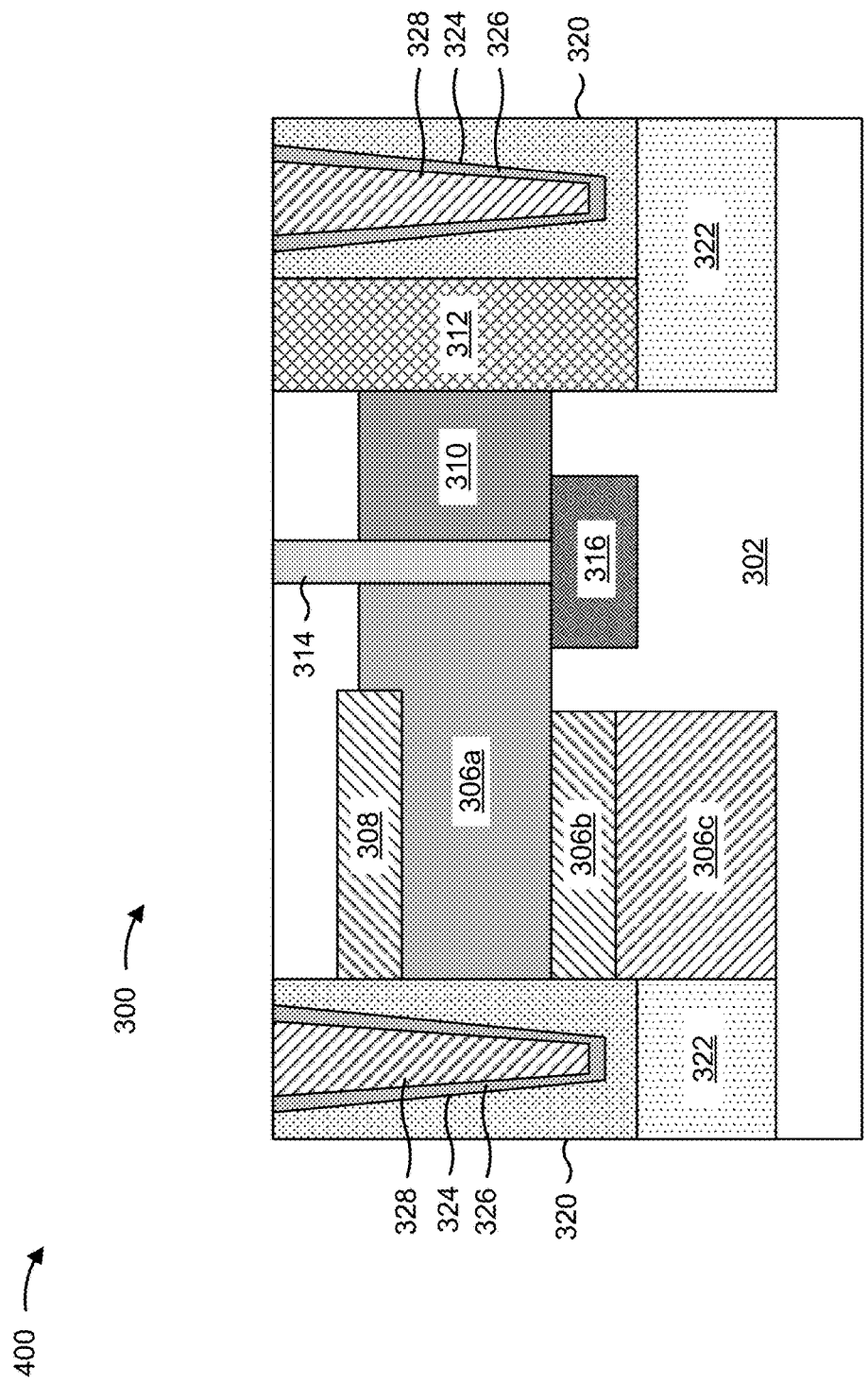
Figure 4J:
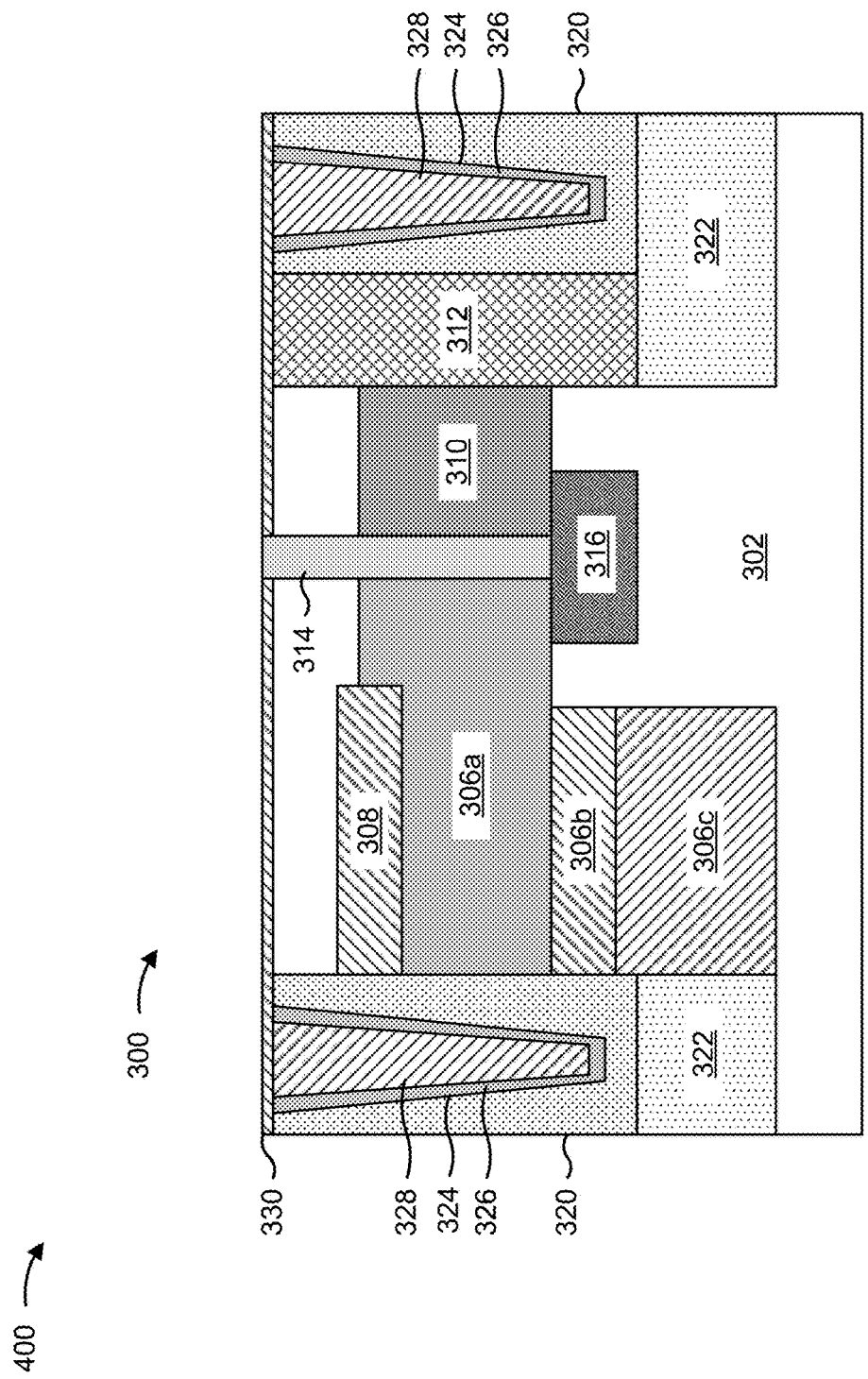
Figure 4K:
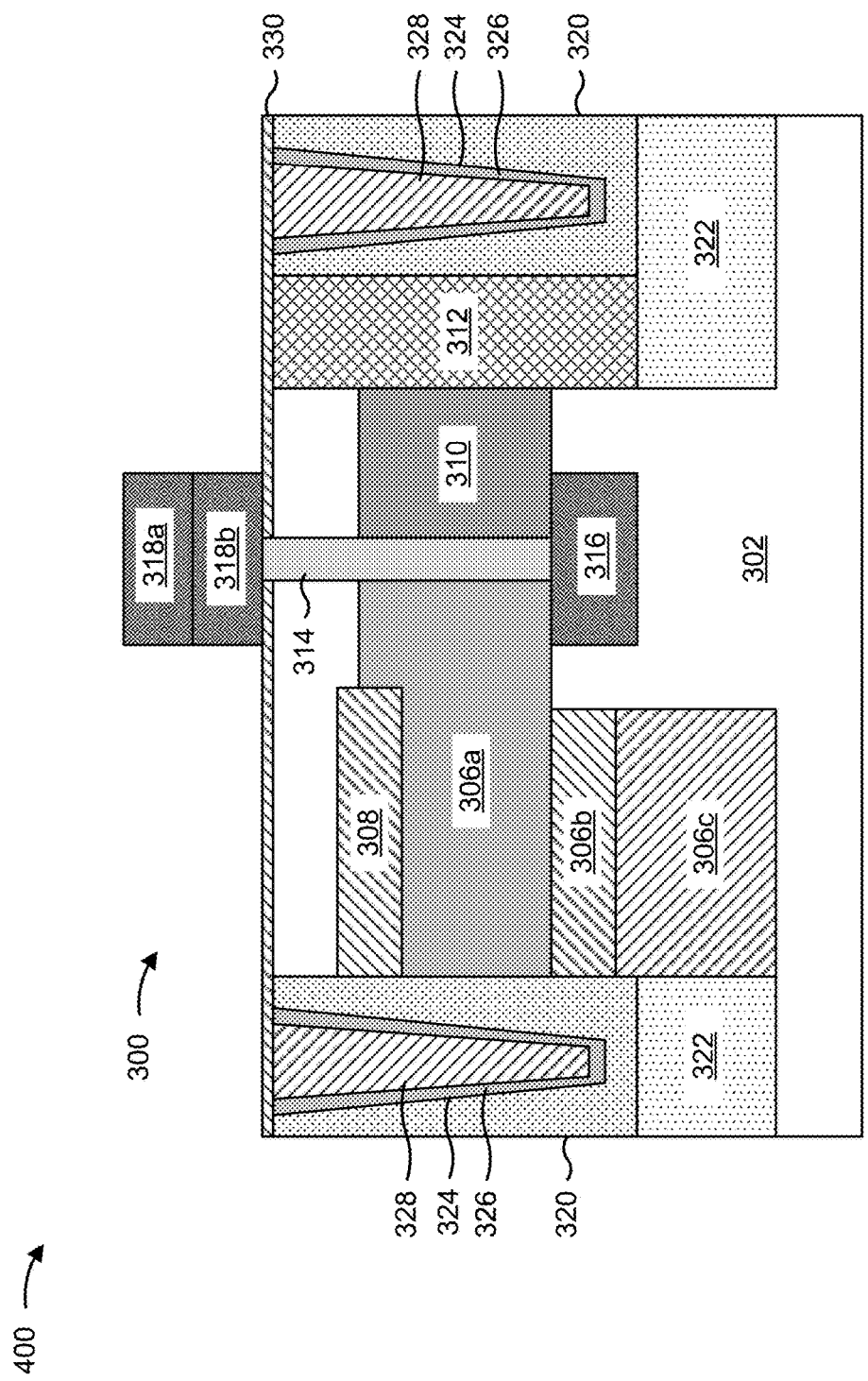
Figure 4L:
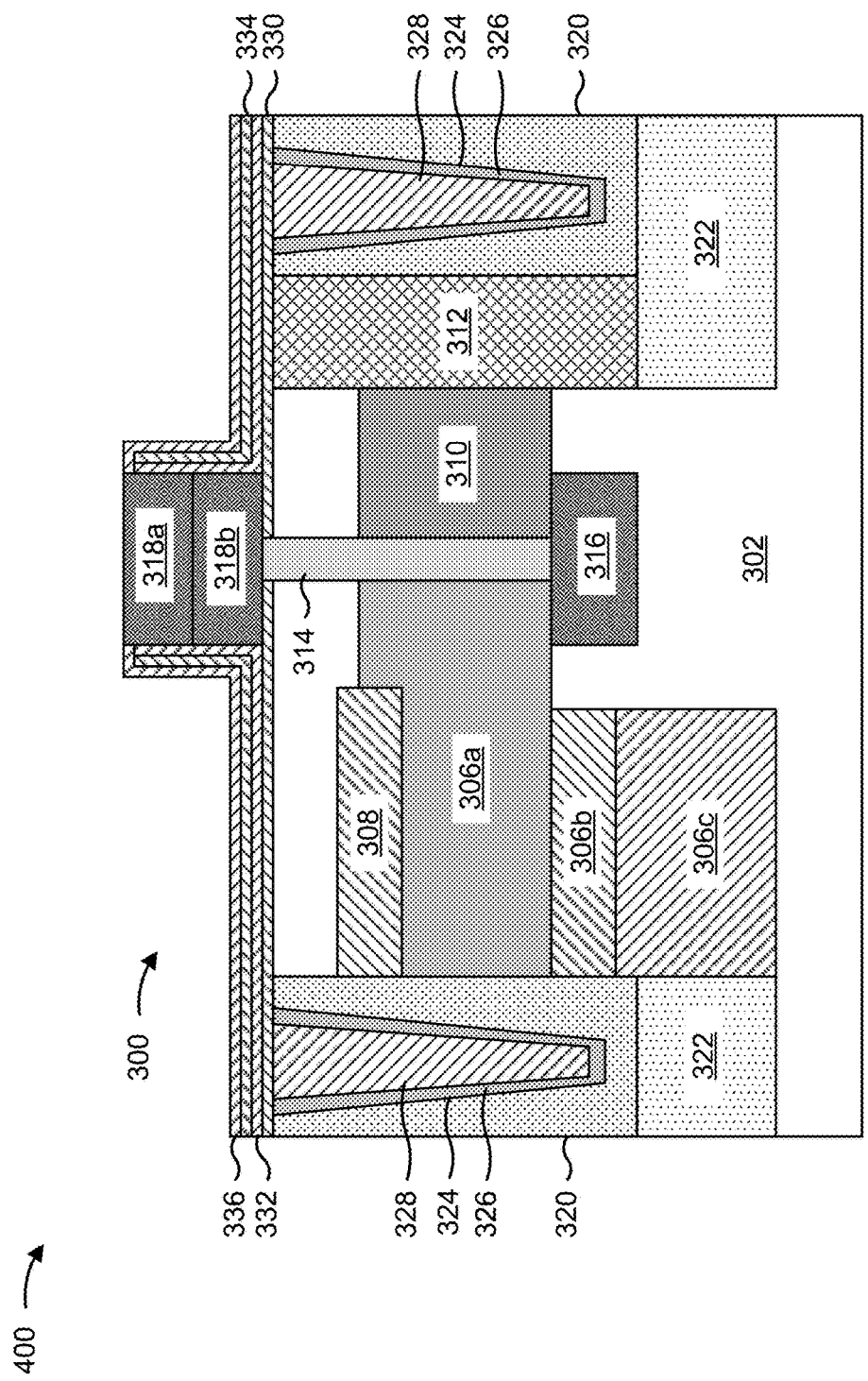
Figure 4M:
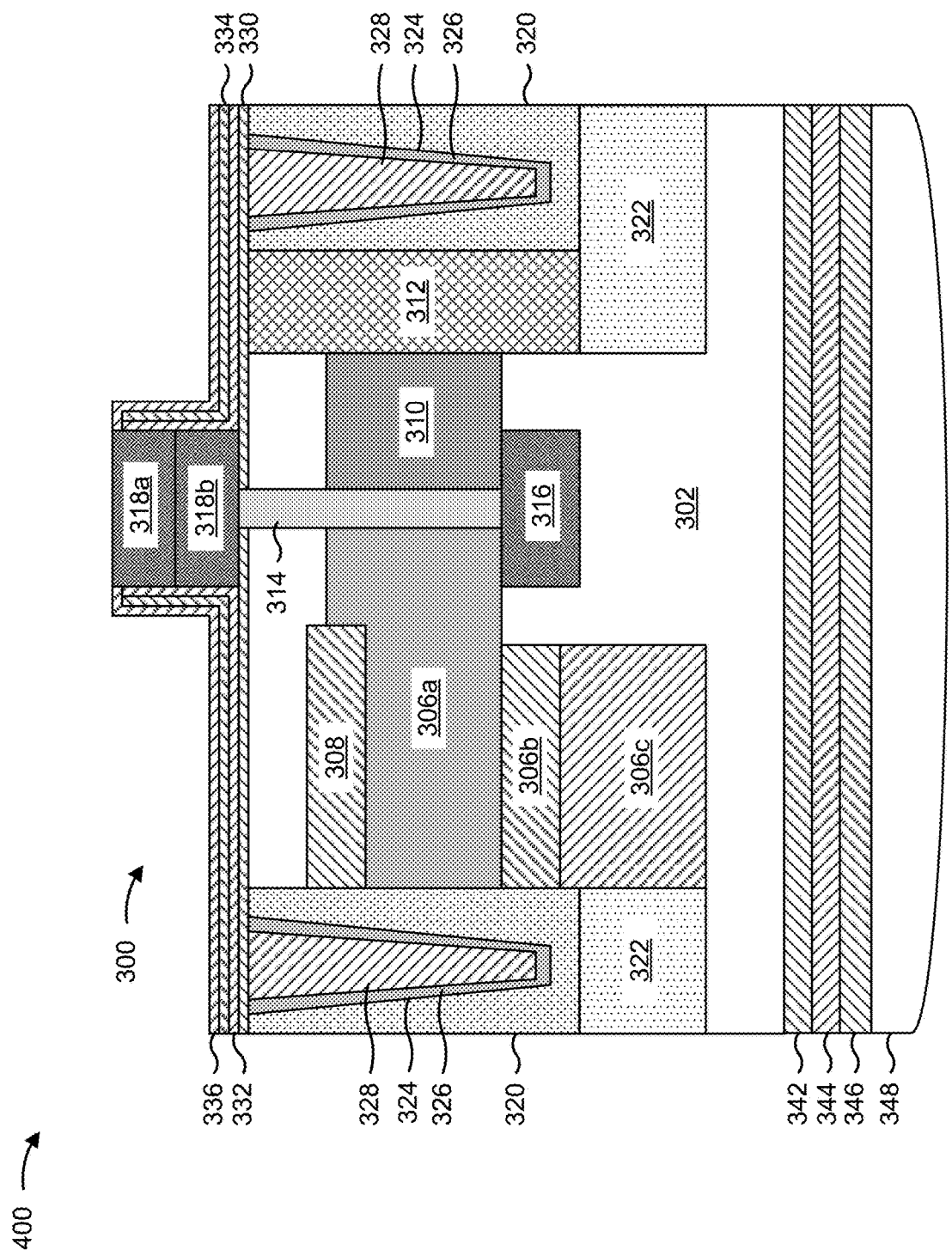
Figure 4N:
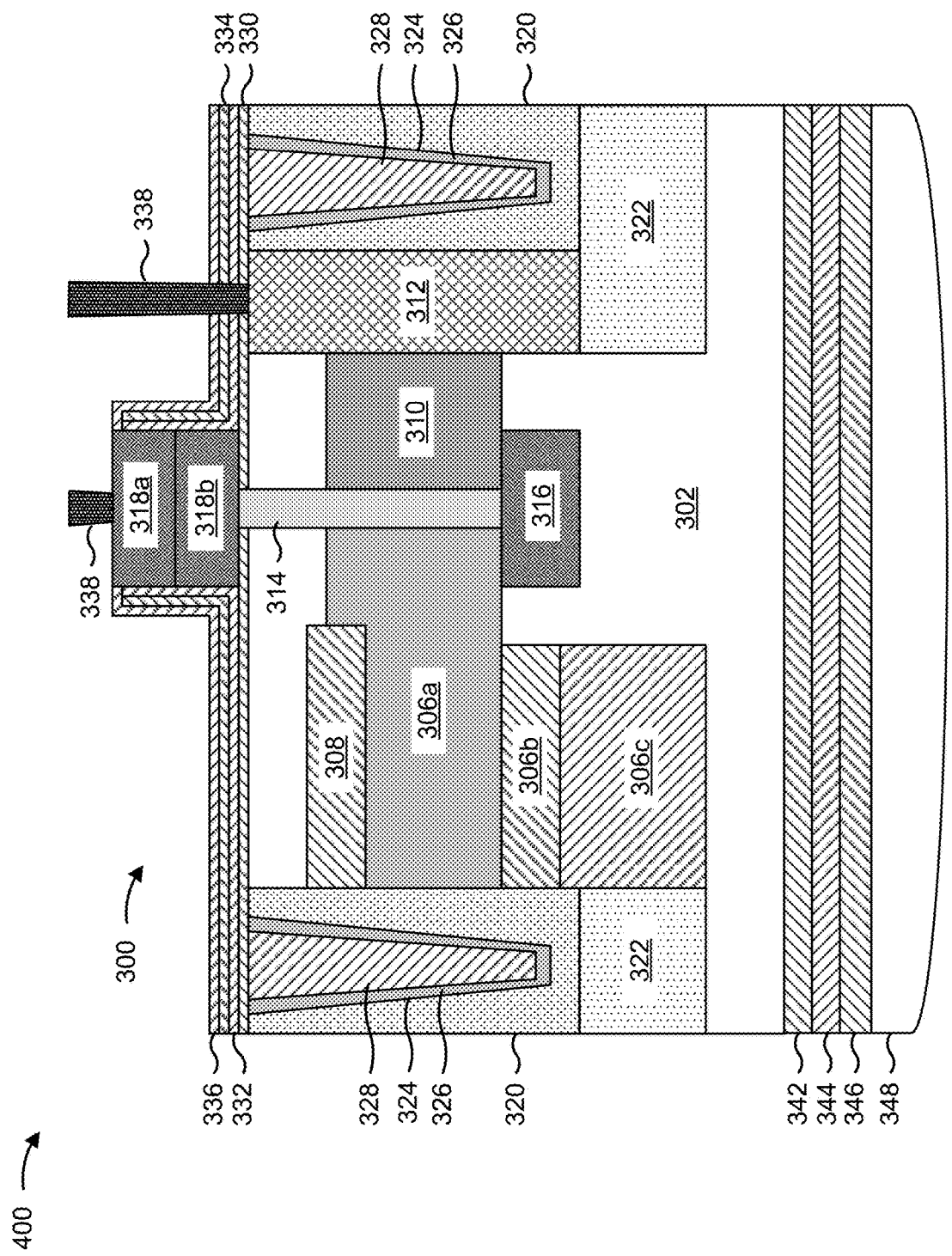
Figure 4O:
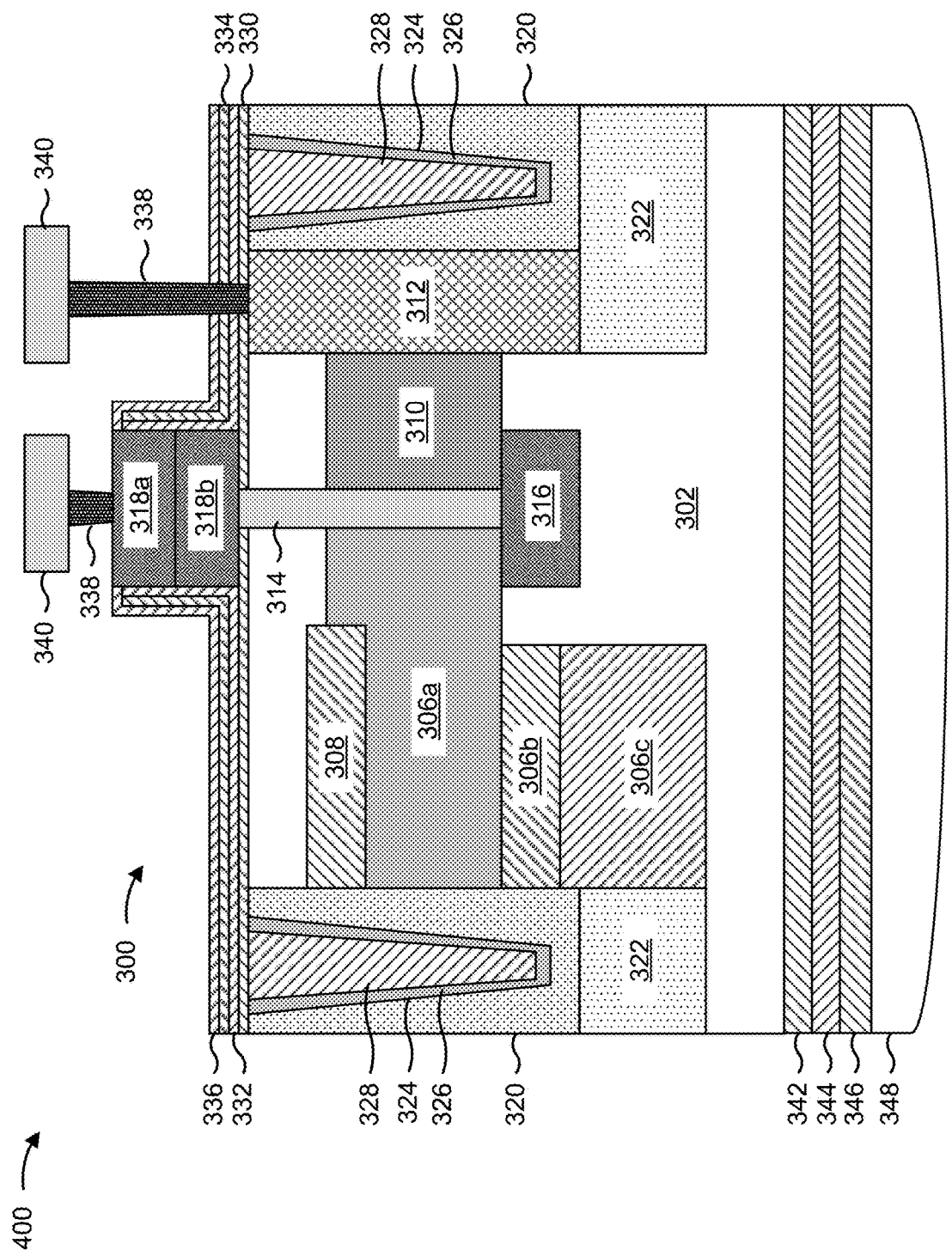

FIGS. 4A-4O are diagrams of an example implementation 400 described herein. Example implementation 400 may be an example process for forming the pixel sensor 300. In some implementations, the example techniques and procedures described in connection with FIGS. 4A-4O may be used in connection with other pixel sensors described herein. As shown in FIG. 4A, the example process for forming the pixel sensor 300 may be performed in connection with the substrate 302.

As shown in FIG. 4B, the cell p-well region (CPW) 320 and the deep p-well region (DPW) 322 may be formed in the substrate 302. For example, the deep p-well region 322 may be formed (e.g., as a circle or ring shape in a top-down view) in the substrate 302, and the cell p-well region 320 may be formed (e.g., as a circle or ring shape in a top-down view) in the substrate 302 above and/or over the deep p-well region 322 to provide electrical isolation and/or optical isolation for the pixel sensor 300. In some implementations, the ion implantation tool 114 dopes the substrate 302 by ion implantation to form the cell p-well region 320 and the deep p-well region 322. For example, the ion implantation tool 114 may implant p⁺ ions into a first region of the substrate 302 to form the deep p-well region 322, and may implant p⁺ ions into a second region of the substrate 302 to form the cell p-well region 320 above and/or over the deep p-well region 322. In some implementations, the substrate 302 may be doped using another doping technique such as diffusion to form the cell p-well region 320 and/or the deep p-well region 322. In some implementations, the substrate 302 may be doped with different p⁺ dopant concentrations to form the cell p-well region 320 and/or the deep p-well region 322.

As shown in FIG. 4C, the substrate 302 may be doped to form the p-type region 316. The ion implantation tool 114 may dope the substrate 302 to form the p-type region 316. The ion implantation tool 114 may implant p⁺ ions into the substrate 302 to form the p-type region 316. In some implementations, the p-type region 316 of the substrate 302 may be doped using another doping technique such as diffusion. The ion implantation tool 114 may form the p-type region 316 within the perimeter of the cell p-well region 320 and/or within the perimeter of the deep p-well region 322.

As shown in FIG. 4D, a plurality of regions of the substrate 302 may be doped to form one or more n-type regions 306b and 306c, and to form the drain region 312. In some implementations, the ion implantation tool 114 dopes the plurality of regions of the substrate 302 by one or more ion implantation operations. For example, the ion implantation tool 114 may implant n⁺ ions in the substrate 302 to form the n-type region 306c, may implant n⁺ ions in the substrate 302 to form the n-type region 306b above and/or over the n-type region 306c, and may implant n⁺ ions in the substrate 302 to form the drain region 312 above and/or over the deep p-well region 322. The ion implantation tool 114 may form the n-type region 306b and the n-type region 306c adjacent to the cell p-well region 320 and the deep p-well region 322 such that the n-type region 306b and the n-type region 306c are located within the perimeter of the cell p-well region 320 and the deep p-well region 322. The ion implantation tool 114 may form the drain region 312 adjacent to the cell p-well region 320 such that the drain region 312 is located within the perimeter of the cell p-well region 320. In some implementations, the plurality of regions of the substrate 302 may be doped using another doping technique such as diffusion. In some implementations, the n-type region 306b and the n-type region 306c may be doped with different n-type dopant concentrations.

As shown in FIG. 4E, a plurality of regions of the substrate 302 may be doped to form the n-type region 306a and the drain extension region 310. In some implementations, the ion implantation tool 114 dopes the plurality of regions of the substrate 302 by one or more ion implantation operations. For example, the ion implantation tool 114 may implant n⁺ ions in the substrate 302 to form the n-type region 306a, and may implant n⁺ ions in the substrate 302 to form the drain extension region 310. The ion implantation tool 114 may form the n-type region 306a above and/or over the n-type region 306b, and within the perimeter of the cell p-well region 320. The ion implantation tool 114 may form the drain extension region 310 adjacent to the n-type region 306a and the drain region 312, and within the perimeter of the cell p-well region 320. In some implementations, the plurality of regions of the substrate 302 may be doped using another doping technique such as diffusion. In some implementations, the n-type region 306a, the n-type region 306b, and/or the n-type region 306c may be doped with different n-type dopant concentrations. In some implementations, the drain extension region 310 and the drain region 312 may be doped with different n-type dopant concentrations.

As further shown in FIG. 4E, the substrate 302 may be doped to form the p-type region 308. The ion implantation tool 114 may dope the substrate 302 to form the p-type region 308 above and/or over at least a portion of the n-type region 306a. The ion implantation tool 114 may implant p⁺ ions into the substrate 302 to form the p-type region 308. In some implementations, the plurality of regions of the substrate 302 may be doped using another doping technique such as diffusion. The ion implantation tool 114 may form the p-type region 308 within the perimeter of the cell p-well region 320.

As shown in FIG. 4F, the transfer gate 314 may be formed above and/or over the p-type region 316, and between the n-type region 306a and the drain extension region 310. Moreover, the transfer gate 314 may be formed such that the transfer gate 314 at least partially surrounds a plurality of sides of the plurality of channel fins 352 between the n-type region 306a and the drain extension region 310. The deposition tool 102 may deposit the transfer gate 314 by a CVD technique, a PVD technique, an ALD technique, or another type of deposition technique; the plating tool 112 may deposit the transfer gate 314 by an electroplating operation; or a combination thereof. The transfer gate 314 may be formed such that the transfer gate 314 extends to the top surface of the substrate 302, as shown in FIG. 4F.

As shown in FIG. 4G, the cell p-well region 320 may be etched to form the isolation structure 324 such that the isolation structure 324 surrounds the one or more n-type regions 306, the p-type region 308, the drain extension region 310, the drain region 312, the transfer gate 314, and the p-type region 316. The deposition tool 102 may form a photoresist layer on the substrate 302 and on the cell p-well region 320, the exposure tool 104 may expose the photoresist layer to a radiation source to pattern the photoresist layer, the developer tool 106 may develop and remove portions of the photoresist layer to expose the pattern, and the etch tool 108 may etch portions of the cell p-well region 320 to form the isolation structure 324. The etch tool 108 may etch the isolation structure 324 down into the cell p-well region 320 from a top surface of the cell p-well region 320. In some implementations, a photoresist removal tool removes the remaining portions of the photoresist layer (e.g., using a chemical stripper, a plasma asher, and/or another technique) after the etch tool 108 etches the cell p-well region 320.

As shown in FIG. 4H, the isolation structure 324 may be lined with the field implant layer (FIL) 326. In some implementations, the field implant layer 326 may be formed by doping the cell p-well region 320 with p⁺ ions to increase the p-type dopant concentration along the sidewalls and the bottom surface of the isolation structure 324. For example, the ion implantation tool 114 may dope the sidewalls and the bottom surface of the isolation structure 324 with a p-type dopant to form the field implant layer 326. In some implementations, the field implant layer 326 is formed by epitaxial growth on the sidewalls and the bottom surface of the isolation structure 324. In these examples, the field implant layer 326 may be formed with or without in situ doping during the epitaxial growth.

As shown in FIG. 4I, the oxide layer 328 may be filled in the isolation structure 324 above and/or over the field implant layer 326. The deposition tool 102 may deposit the oxide layer 328 by a CVD technique, a PVD technique, an ALD technique, or another type of deposition technique. The planarization tool 110 may planarize the oxide layer 328 after the oxide layer 328 is deposited in the isolation structure 324.

As shown in FIG. 4J, the gate dielectric layer 330 may be formed above and/or over the top surface of the substrate 302, and above and/or over the cell p-well region 320. The deposition tool 102 may deposit the gate dielectric layer 330 using a CVD technique, a PVD technique, an ALD technique, or another type of deposition technique. The planarization tool 110 may planarize the gate dielectric layer 330 after the gate dielectric layer 330 is deposited.

As shown in FIG. 4K, the transfer gate electrode 318b may be formed over and/or on the gate dielectric layer 330, and coupled to the transfer gate 314. The n-doped upper transfer gate electrode region 318a may be formed over and/or on the transfer gate electrode 318b. In some implementations, the deposition tool 102 deposits the n-doped upper transfer gate electrode region 318a and/or the transfer gate electrode 318b using a CVD technique, a PVD technique, an ALD technique, or another type of deposition technique; the plating tool 112 deposits the n-doped upper transfer gate electrode region 318a and/or the transfer gate electrode 318b using an electroplating operation; or a combination thereof. In some implementations, the ion implantation tool 114 forms the n-doped upper transfer gate electrode region 318a and/or the transfer gate electrode 318b using one or more ion implantation operations. In some implementations, the planarization tool 110 planarizes the n-doped upper transfer gate electrode region 318a and/or the transfer gate electrode 318b after formation of the n-doped upper transfer gate electrode region 318a and/or the transfer gate electrode 318b.

As shown in FIG. 4L, the sidewall oxide layer 332 may be formed over and/or on the gate dielectric layer 330, on the sidewalls of the n-doped upper transfer gate electrode region 318a, and on the sidewalls of the transfer gate electrode 318b. The deposition tool 102 may deposit the sidewall oxide layer 332 using a CVD technique, a PVD technique, an ALD technique, or another type of deposition technique. The planarization tool 110 may planarize the sidewall oxide layer 332 after the sidewall oxide layer 332 is deposited.

As further shown in FIG. 4L, the remote plasma oxide (RPO) layer 334 may be formed over and/or on the sidewall oxide layer 332, over the sidewalls of the n-doped upper transfer gate electrode region 318a, and over the sidewalls of the transfer gate electrode 318b. The deposition tool 102 may deposit the remote plasma oxide layer 334 using a CVD technique, a PVD technique, an ALD technique, or another type of deposition technique. The planarization tool 110 may planarize the remote plasma oxide layer 334 after the remote plasma oxide layer 334 is deposited.

As further shown in FIG. 4L, the contact etch stop layer (CESL) 336 may be formed over and/or on the remote plasma oxide layer 334, over the sidewalls of the n-doped upper transfer gate electrode region 318a, and over the sidewalls of the transfer gate electrode 318b. The deposition tool 102 may deposit the contact etch stop layer 336 using a CVD technique, a PVD technique, an ALD technique, or another type of deposition technique. The planarization tool 110 may planarize the contact etch stop layer 336 after the contact etch stop layer 336 is deposited.

As shown in FIG. 4M, back side processing may be performed on the pixel sensor 300 to form the $p^+$ ion layer 342, the ARC 344, the color filter layer 346, and the micro-lens layer 348 over the back side or the bottom side of the substrate 302. The deposition tool 102 may deposit the $p^+$ ion layer 342, the ARC 344, the color filter layer 346, and the micro-lens layer 348 using a CVD technique, a PVD technique, an ALD technique, or another type of deposition technique. The $p^+$ ion layer 342 may be formed over and/or on the substrate 302. The ARC 344 may be formed over and/or on the $p^+$ ion layer 342. The color filter layer 346 may be formed over and/or on the ARC 344. The micro-lens layer 348 may be formed over and/or on the color filter layer 346. The planarization tool 110 may planarize the $p^+$ ion layer 342, the ARC 344, and the color filter layer 346.

As shown in FIG. 4N, the interconnects 338 may be formed (e.g., in a dielectric layer above the substrate 302). A first interconnect 338 may be formed such that the first interconnect 338 contacts the n-doped upper transfer gate electrode region 318a. A second interconnect 338 may be formed such that the second interconnect 338 contacts the drain region 312. The deposition tool 102 may deposit the material of the interconnects 338 using a CVD technique, a PVD technique, an ALD technique, or another type of deposition technique, the plating tool 112 may deposit the material of the interconnects 338 using an electroplating operation, or a combination thereof. The planarization tool 110 may planarize the interconnects 338 after the interconnects 338 are deposited.

As shown in FIG. 4O, the metallization layer 340 may be formed (e.g., over and/or on a dielectric layer or an IMD layer) such that the metallization layer 340 contacts the interconnects 338. The deposition tool 102 may deposit the material of the metallization layer 340 using a CVD technique, a PVD technique, an ALD technique, or another type of deposition technique, the plating tool 112 may deposit the material of the metallization layer 340 using an electroplating operation, or a combination thereof. The planarization tool 110 may planarize the metallization layer 340 after the metallization layer 340 is deposited.

As indicated above, FIGS. 4A-4O are provided as an example. Other examples may differ from what is described with regard to FIGS. 4A-4O.

Figure 5B:
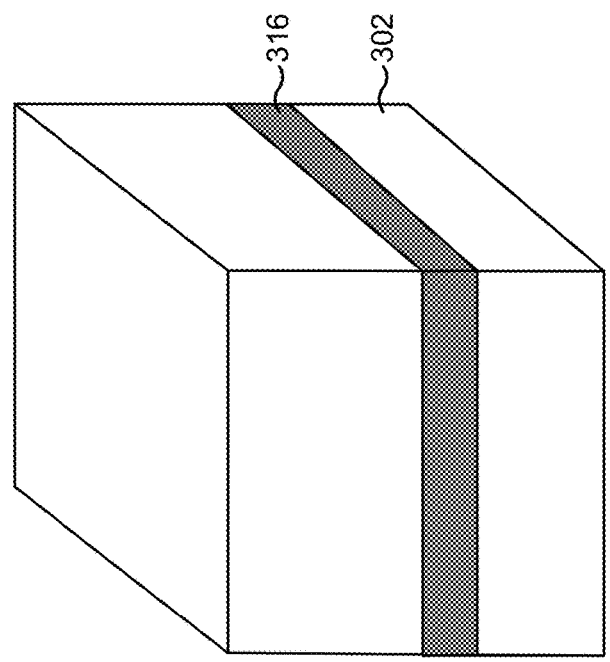

FIGS. 5A-5H are diagrams of an example implementation 500 described herein. Example implementation 500 is an example process for forming a portion of the pixel sensor 300. The techniques and/or operations described in connection with FIGS. 5A-5H may be performed in connection with the example process described above in connection with FIGS. 4A-4O. As shown in FIG. 5A, the example process for forming the pixel sensor 300 may be performed in connection with the substrate 302.

As shown in FIG. 5B, the p-type region 316 may be formed in the substrate 302. The ion implantation tool 114 may dope a plurality of portions of the substrate 302 to form the plurality of portions of the p-type region 316. The ion implantation tool 114 may implant $p^+$ ions into the substrate 302 to form the p-type region 316. The ion implantation tool 114 may form the p-type region 316 to a thickness or height to provide sufficient electrical isolation between the transfer gate 314 and the substrate 302.

Figure 5C:
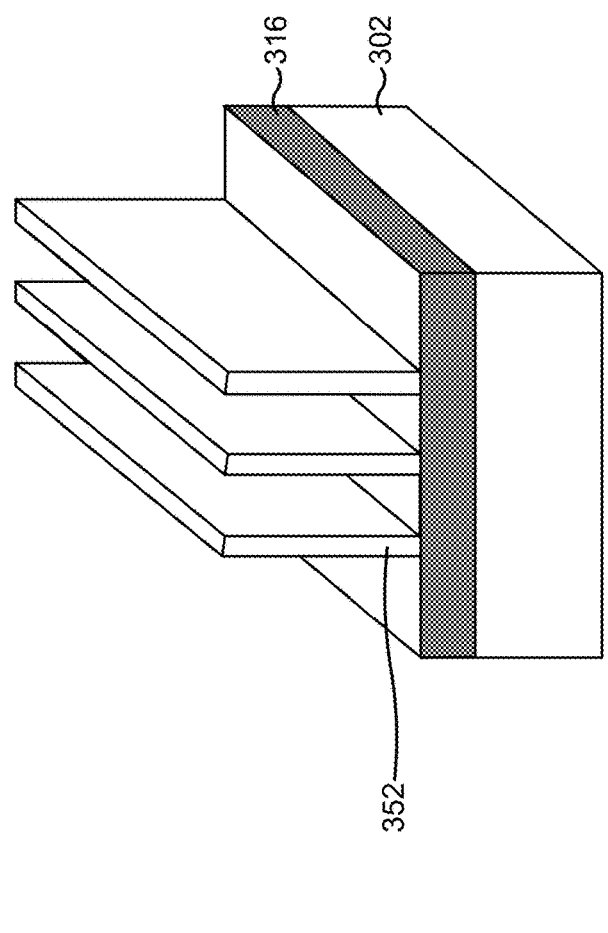

As shown in FIG. 5C, the plurality of channel fins 352 may be formed in the substrate 302 above and/or over the p-type region 316. One or more semiconductor processing tools may form the plurality of channel fins 352 in the substrate 302. For example, the deposition tool 102 may form a photoresist layer on the substrate 302, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 302 to form the plurality of channel fins 352. In some implementations, a photoresist removal tool removes the remaining portions of the photoresist layer (e.g., using a chemical stripper, a plasma asher, and/or another technique) after the etch tool 108 etches the substrate 302.

Figure 5D:
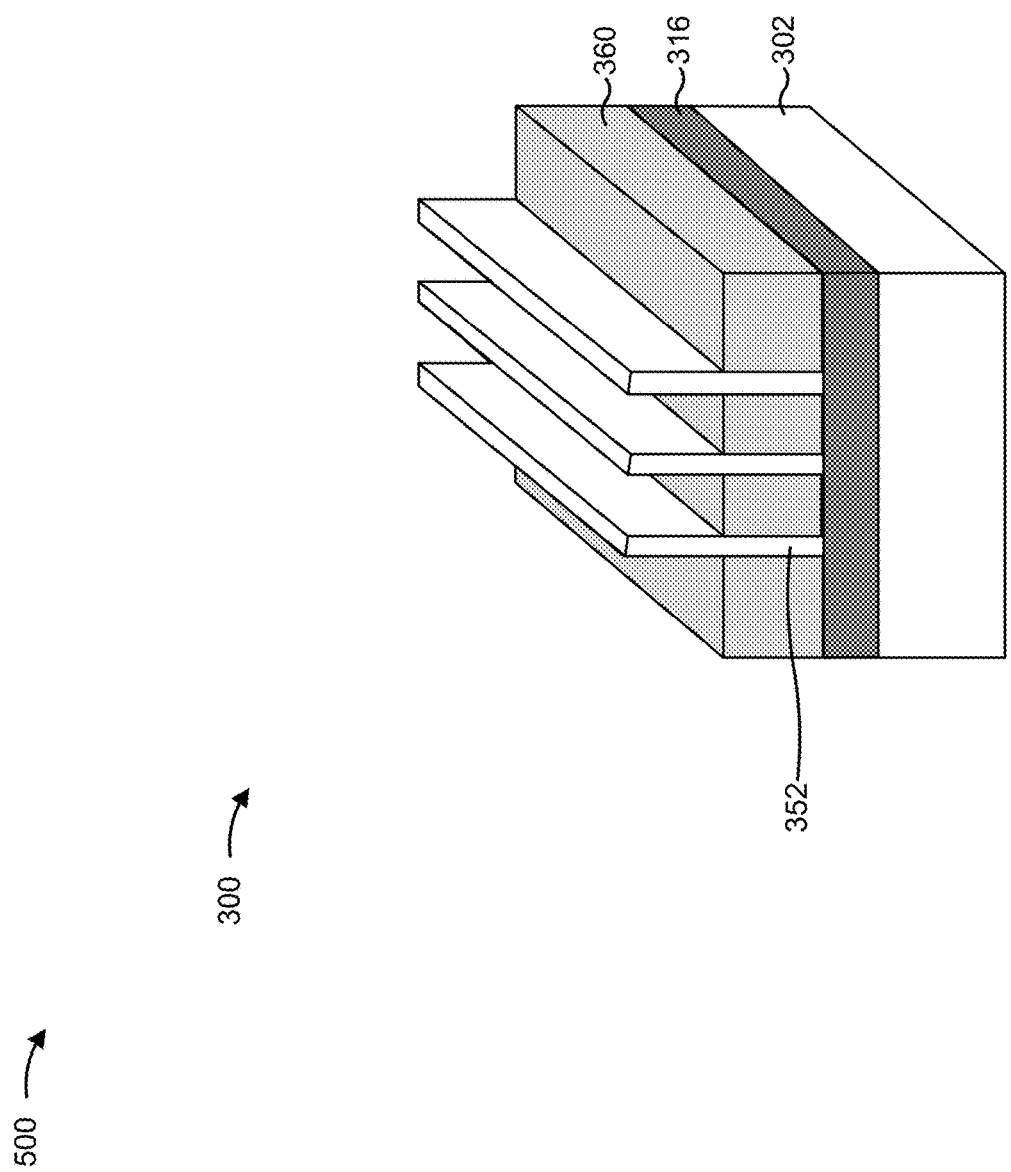

As shown in FIG. 5D, the plurality of isolation regions 360 may be formed over corresponding portions of the substrate 302 (and over corresponding portions of the p-type region 316), and in between the plurality of channel fins 352. The deposition tool 102 may deposit the plurality of isolation regions 360 by a CVD technique, a PVD technique, an ALD technique, and/or another type of deposition technique.

Figure 5E:
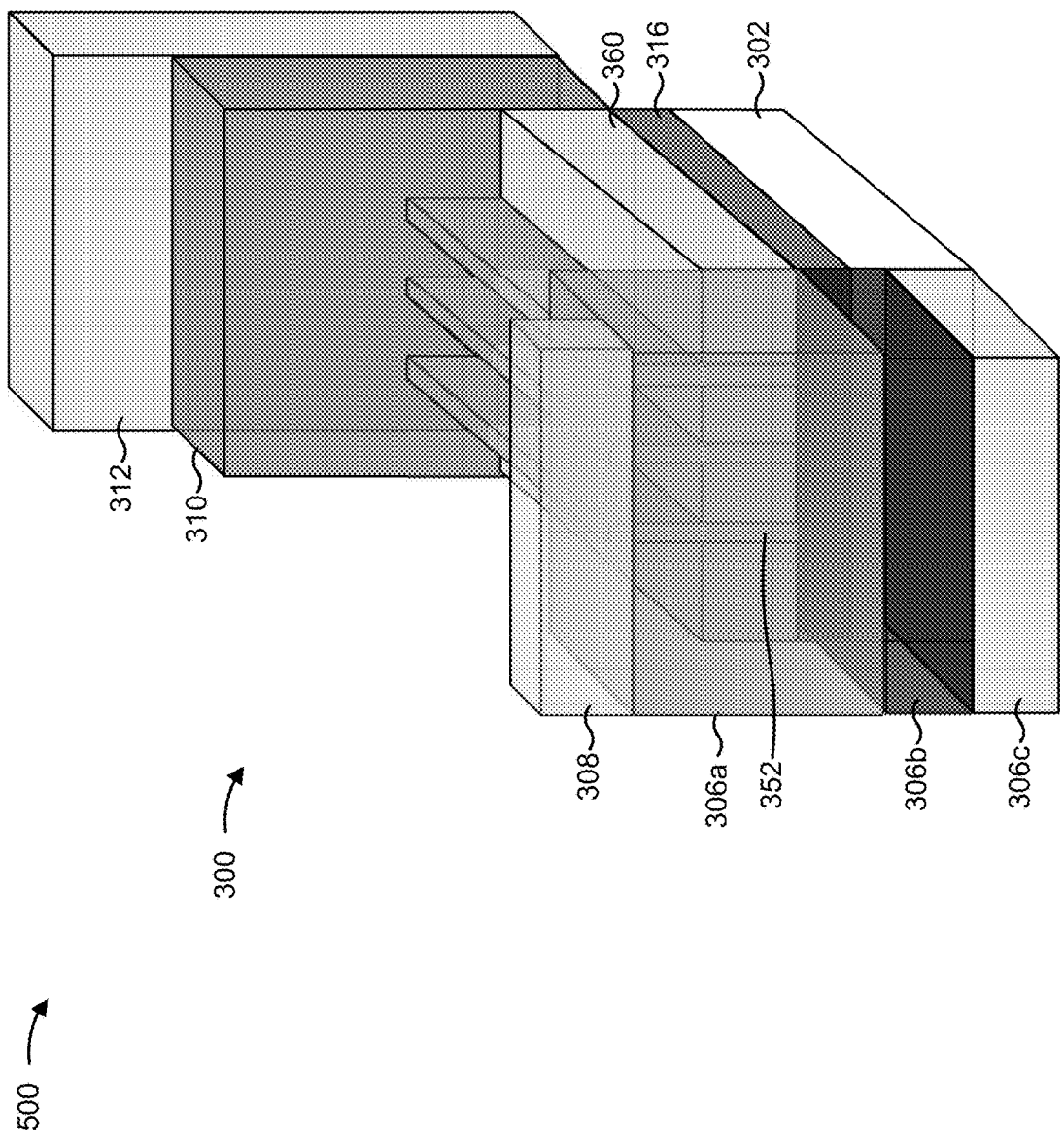

As shown in FIG. 5E, the drain extension region 310 may be formed adjacent to the plurality of channel fins 352 at a first end (or at a first side) of the plurality of channel fins 352 such that the drain extension region 310 is coupled and/or electrically connected to the plurality of channel fins 352. The drain region 312 may be formed adjacent to the drain extension region 310 such that the drain region 312 and the drain extension region 310 are coupled and/or electrically connected. In some implementations, the ion implantation tool 114 dopes the substrate 302 by one or more ion implantation operations to form the drain region 312 and the drain extension region 310. For example, the ion implantation tool 114 may implant n+ions in the substrate 302 to form the drain region 312 and the drain extension region 310 adjacent to the drain region 312. In some implementations, the substrate 302 may be doped using another doping technique such as diffusion to form the drain region 312 and/or the drain extension region 310. In some implementations, the drain region 312 may be formed by epitaxial growth. In some implementations, the drain region 312 and the drain extension region 310 may be doped with different n-type dopant concentrations.

As further shown in FIG. 5E, one or more regions of the substrate 302 may be doped to form the one or more n-type regions 306. In some implementations, the ion implantation tool 114 dopes the one or more regions of the substrate 302 by one or more ion implantation operations. For example, the ion implantation tool 114 may implant $n^+$ ions in the substrate 302 to form the n-type region 306c, may implant $n^+$ ions in the substrate 302 to form the n-type region 306b above and/or over the n-type region 306c, and may implant $n^+$ ions in the substrate 302 to form the n-type region 306a above and/or over the n-type region 306b. The ion implantation tool 114 may form the n-type region 306a adjacent to the plurality of channel fins 352 at a second end (or a second side) opposing the first end. The ion implantation tool 114 may form the n-type region 306a such that the n-type region 306a is coupled and/or electrically connected to the plurality of channel fins 352 at the second end (or the second side) of the plurality of channel fins 352. In some implementations, one or more regions of the substrate 302 may be doped using another doping technique such as diffusion. In some implementations, two or more of the n-type region 306a, the n-type region 306b, of the n-type region 306c may be doped with different n-type dopant concentrations.

As further shown in FIG. 5E, the substrate 302 may be doped to form the p-type region 308. In some implementations, the ion implantation tool 114 dopes the substrate 302 by ion implantation. For example, the ion implantation tool 114 may implant $p^+$ ions into the substrate 302 to form the p-type region 308 above and/or over the n-type region 306a. In some implementations, the substrate 302 may be doped using another doping technique such as diffusion.

Figure 5F:
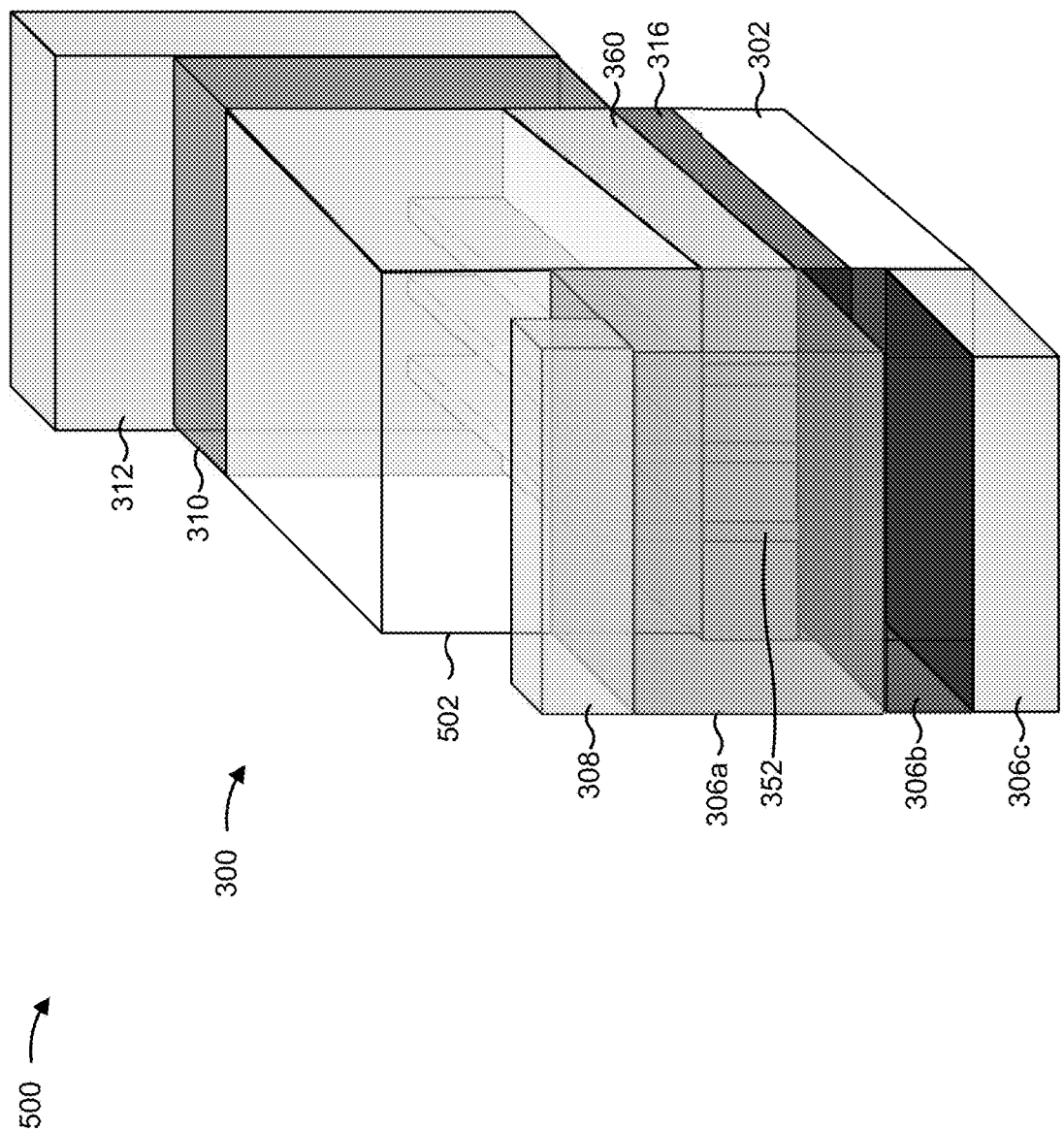

As shown in FIG. 5F, an oxide layer 502 may be formed over and/or on the plurality of isolation regions 360, and over and/or on the plurality of channel fins 352. Moreover, the oxide layer 502 may be formed between the drain extension region 310 and the one or more n-type regions 306. The deposition tool 102 may deposit the oxide layer 502 by a CVD technique, a PVD technique, an ALD technique, or another type of deposition technique.

Figure 5G:
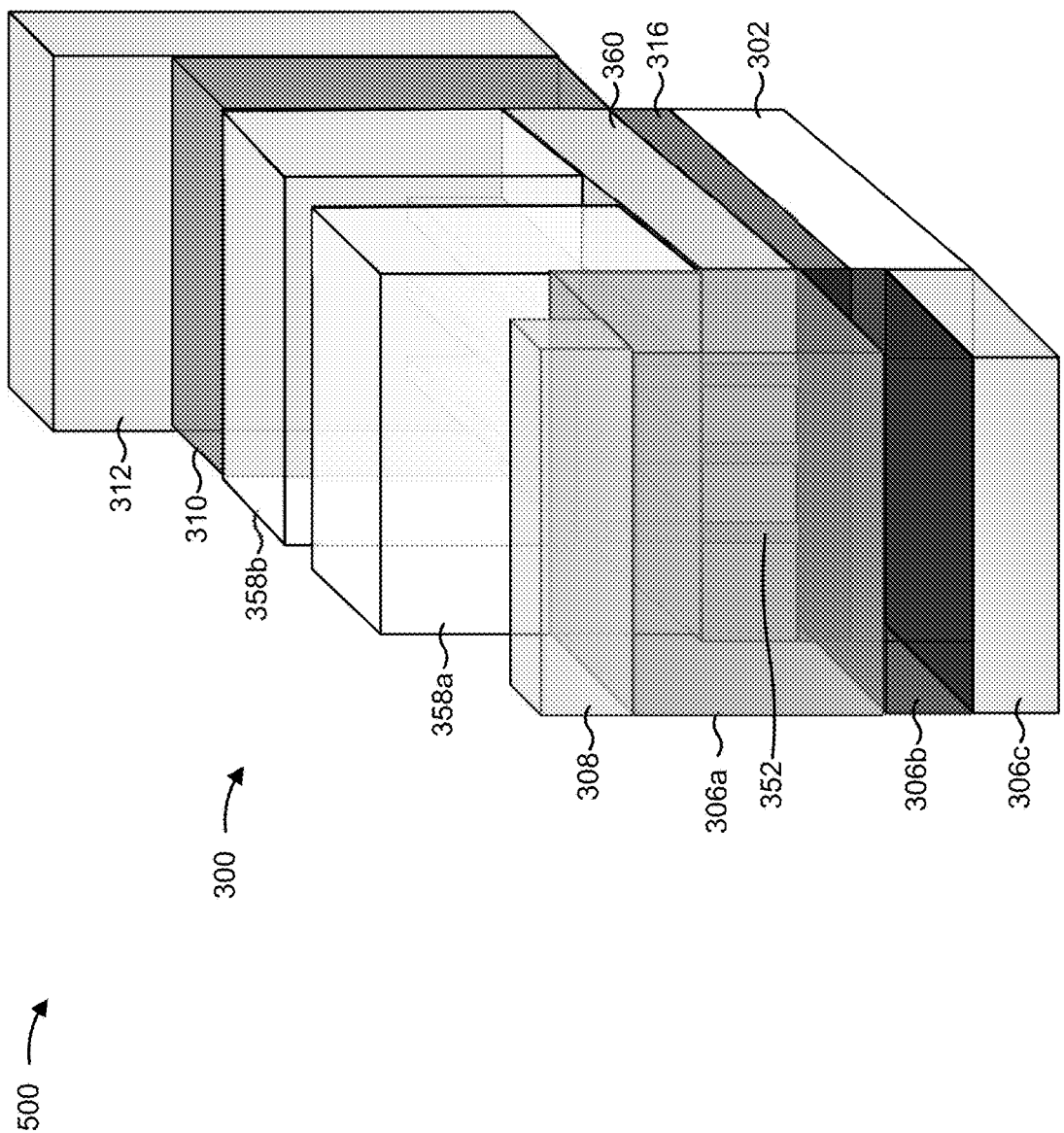

As shown in FIG. 5G, the oxide layer 502 may be etched to form the buffer oxide region 358a and the buffer oxide region 358b. For example, the deposition tool 102 may form a photoresist layer on the oxide layer 502, the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 502 to form the buffer oxide region 358a and the buffer oxide region 358b. The etch tool 108 may etch through the oxide layer 502 to expose portions of the plurality of channel fins 352 such that the transfer gate 314 may be formed around the exposed portions of the plurality of channel fins 352. In some implementations, a photoresist removal tool removes the remaining portions of the photoresist layer (e.g., using a chemical stripper, a plasma asher, and/or another technique) after the etch tool 108 etches the oxide layer 502.

Figure 5H:
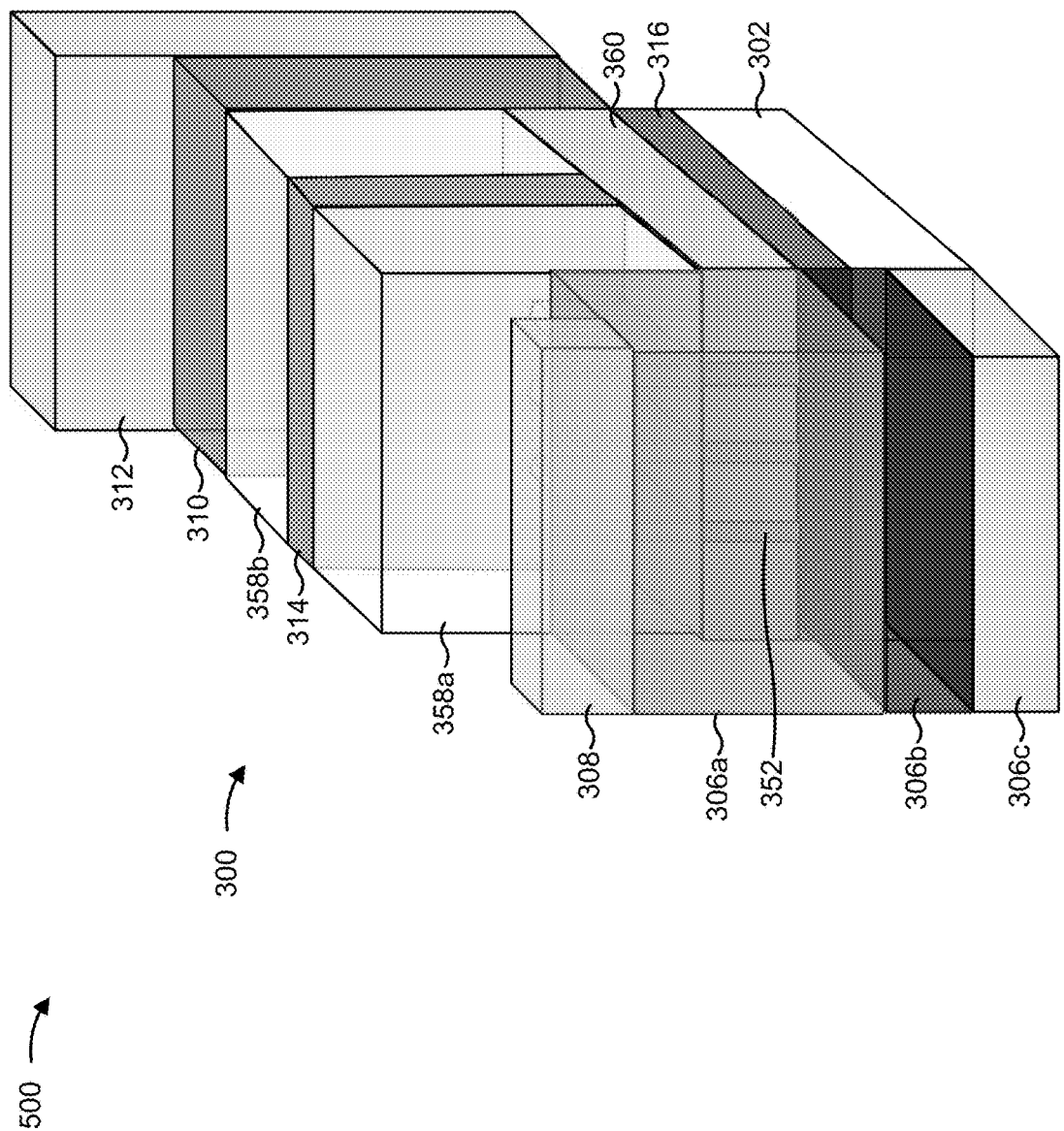

As shown in FIG. 5H, the transfer gate 314 may be formed above and/or over the substrate 302, above and/or over the p-type region 316, and over and/or on the plurality of isolation regions 360. Moreover, the transfer gate 314 may be formed such that the transfer gate 314 at least partially surrounds a plurality of sides of the plurality of channel fins 352. For example, the transfer gate 314 may be formed such that the transfer gate 314 at least partially surrounds three (3) sides of the plurality of channel fins 352. The deposition tool 102 may deposit the transfer gate 314 by a CVD technique, a PVD technique, an ALD technique, or another type of deposition technique; the plating tool 112 may deposit the transfer gate 314 by an electroplating operation; or a combination thereof. The deposition tool 102 and/or the plating tool 112 may form the transfer gate 314 between the buffer oxide region 358a and the buffer oxide region 358b such that the buffer oxide region 358a is between the n-type region 306a and the transfer gate 314, and such that the buffer oxide region 358b is between the drain extension region 310 and the transfer gate 314.

As indicated above, FIGS. 5A-5H are provided as an example. Other examples may differ from what is described with regard to FIGS. 5A-5H.

Figure 6:
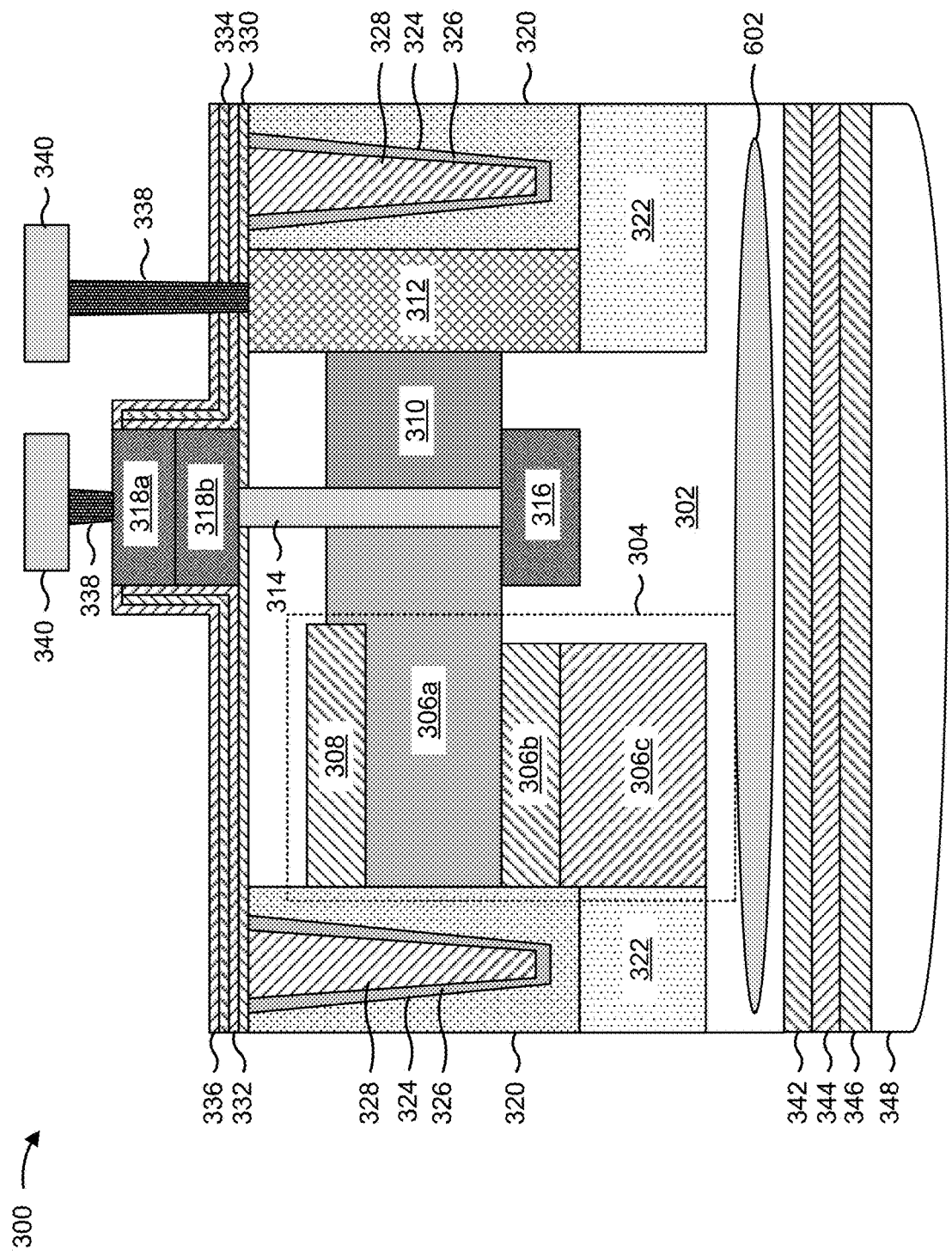
FIG. 6 is a diagram of an example pixel sensor described herein.

FIG. 6 is a diagram of another example of the pixel sensor 300 described herein. FIG. 6 includes a cross-section view of the pixel sensor 300. As shown in FIG. 6, the pixel sensor 300 may include a similar arrangement of components and/or structures shown in FIGS. 3A-3C. In addition, the pixel sensor 300 may further include a deep n-type region 602, which may be referred to as an axial deep n-well or an array deep n-well (ADNW). The deep n-type region 602 may be included in the substrate 302 between the $p^+$ ion layer 342 and the photodiode 304. The deep n-type region 602 may further facilitate the absorption of photons and the migration of electrons through the photodiode 304. In some implementations, the deep n-type region 602 may span across a plurality of pixel sensors (e.g., an array of pixel sensors) including the pixel sensor 300.

As indicated above, FIG. 6 is provided as an example. Other examples may differ from what is described with regard to FIG. 6.

Figure 7:
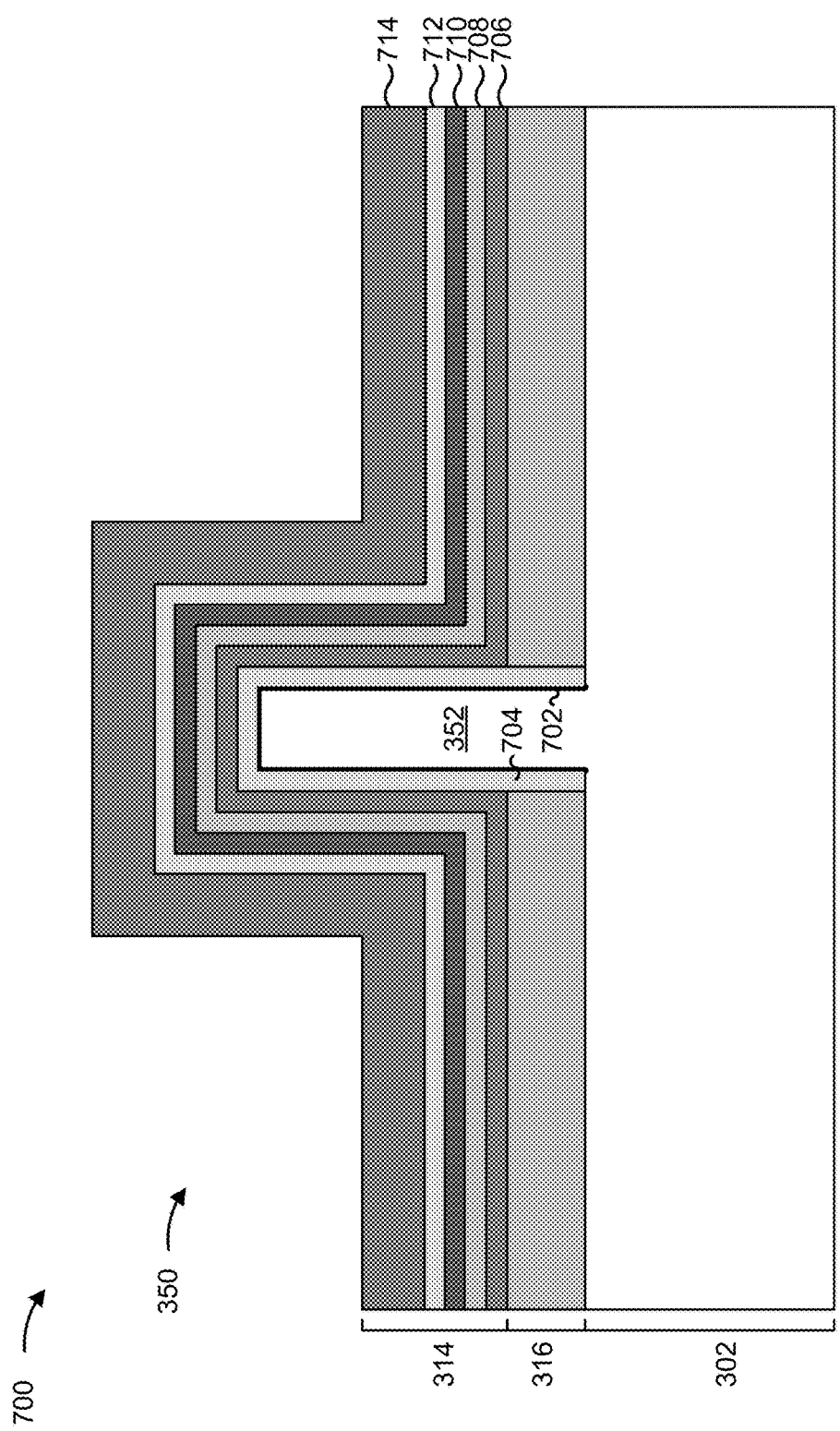
FIG. 7 is a diagram of an example implementation of a transfer gate structure and a channel fin structure described herein.

FIG. 7 is a diagram of an example implementation 700 of a transfer gate structure and a channel fin structure described herein. The transfer gate structure may include the structure of the transfer gate 314 of the transfer finFET 350 described herein. The channel fin structure may include the structure of the plurality of channel fins 352 described herein. As shown in FIG. 7, a channel fin 352 may be formed in the substrate 302. The p-type region 316 may be included over and/or on a portion of the substrate 302. The transfer gate 314 may be included over and/or on the p-type region 316, and over and/or on the channel fin 352.

As shown in FIG. 7, a channel fin 352 may include an extension implant 702 over sidewalls and as top surface of the channel fin 352. The extension implant 702 may be included to dope the exposed portions of the channel fin 352. The extension implant 702 may include a large-angled low-energy implant, and may include p-type doping or n-type doping depending on whether the transfer finFET 350 includes a p-doped metal oxide semiconductor (PMOS) transistor or an n-doped metal oxide semiconductor (NMOS) transistor. A poly oxide layer 704 may be included over and/or on the extension implant 702 on the channel fin 352. In some implementations, the poly oxide layer 704 is used as a hard mask for one or more semiconductor processing operations associated with formation of the transfer gate 314.

In some implementations, the channel fin 352 may include one or more additional layers, and the additional layers may be included over and/or on the channel fin 352. For example, a gate oxide layer may be included over and/or on the channel fin 352, an internal gate layer (e.g., a silicon nitride ($Si_xN_y$)) may be included over and/or on the gate oxide layer, and/or a ferroelectric (or a high-k dielectric) layer such as an aluminum oxide ($Al_xO_y$) may be included over and/or on the gate oxide layer, among other examples. The one or more additional layers may be configured as a tunnel oxide, a charge trapping layer, a blocking layer, and/or another type of layer.

As further shown in FIG. 7, the transfer gate 314 may include a titanium nitride (TiN) layer 706 over and/or on the p-type region 316, and over and/or on the channel fin 352. In some implementations, the transfer gate 314 further includes a bottom interface oxide layer between the p-type region 316 and the transfer gate 314, and between the channel fin 352 and the transfer gate 314. In some implementations, the transfer gate 314 further includes a high-k dielectric layer between the bottom interface oxide layer and the titanium nitride layer 706.

The transfer gate 314 may further include a tantalum nitride (TaN) layer 708 over and/or on the titanium nitride layer 706. Another titanium nitride layer 710 may be included over and/or on the tantalum nitride layer 708. A titanium aluminum (TiAl) layer 712 may be included over and/or on the titanium nitride layer 710. A tungsten layer 714 may be included over and/or on the titanium aluminum layer 712. The combination of the titanium nitride layer 706, the tantalum nitride layer 708, the titanium nitride layer 710, the titanium aluminum layer 712, and the tungsten layer 714 may be referred to as a work function layer. The work function layer is included over a high-k dielectric layer and a bottom interface oxide layer to achieve a low work function for the transfer finFET 350. Accordingly, the work function layer (or the layers included therein) may be used to achieve threshold voltages for the transfer finFET 350.

As indicated above, FIG. 7 is provided as an example. Other examples may differ from what is described with regard to FIG. 7.

Figure 8:
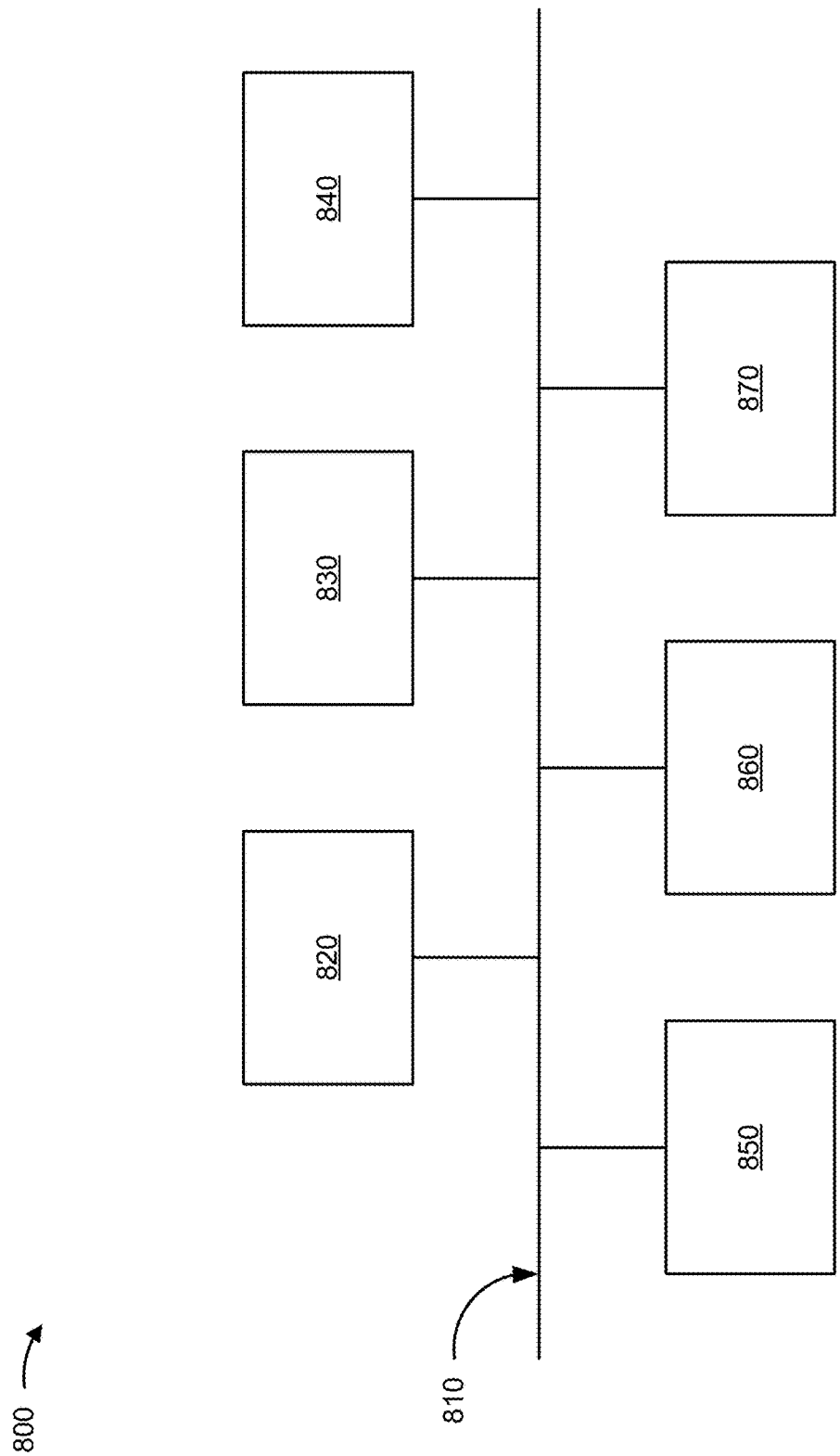
FIG. 8 is a diagram of example components of one or more devices of FIG. 1.

FIG. 8 is a diagram of example components of a device 800. In some implementations, one or more of the semiconductor processing tools 102-114 and/or the wafer/die transport tool 116 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

FIG. 9 is a flowchart of an example process 900 associated with pixel sensor including a forming a pixel sensor. In some implementations, one or more process blocks of FIG. 9 may be performed by one or more semiconductor processing tools (e.g., one or more of the semiconductor processing tools 102-114). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming, in a substrate of a pixel sensor, a plurality of channel fins for a transfer finFET included in the pixel sensor (block 910). For example, the one or more semiconductor processing tools 102-114 may form, in the substrate 302 of the pixel sensor 300, the plurality of channel fins 352 for the transfer finFET 350 included in the pixel sensor, as described above.

As further shown in FIG. 9, process 900 may include forming, in the substrate, an n-type region of a photodiode included in the pixel sensor (block 920). For example, the one or more semiconductor processing tools 102-114 may form, in the substrate 302, the n-type region 306 of the photodiode 304 included in the pixel sensor 300, as described above.

As further shown in FIG. 9, process 900 may include forming, in the substrate, a drain extension region of the transfer finFET, where the plurality of channel fins couple the n-type region and the drain extension region (block 930). For example, the one or more semiconductor processing tools 102-114 may form, in the substrate 302, the drain extension region 310 of the transfer finFET 350, as described above. In some implementations, the plurality of channel fins 352 couple the n-type region 306 and the drain extension region 310.

As further shown in FIG. 9, process 900 may include forming, in the substrate, a drain region coupled to the drain extension region (block 940). For example, the one or more semiconductor processing tools 102-114 may form, in the substrate 302, the drain region 312 coupled to the drain extension region 310, as described above.

As further shown in FIG. 9, process 900 may include forming a transfer gate at least partially around the plurality of channel fins (block 950). For example, the one or more semiconductor processing tools 102-114 may form the transfer gate 314 at least partially around the plurality of channel fins 352, as described above.

As further shown in FIG. 9, process 900 may include connecting the drain region to a first interconnect (block 960). For example, the one or more semiconductor processing tools 102-114 may connect the drain region 312 to the interconnect 338, as described above.

As further shown in FIG. 9, process 900 may include connecting the transfer gate to a second interconnect (block 970). For example, the one or more semiconductor processing tools 102-114 may connect the transfer gate 314 to the interconnect 338, as described above.

Process 900 may include additional implementations, such as any single implementation or any combination of implementations described below and/or in connection with one or more other processes described elsewhere herein.

In a first implementation, forming the plurality of channel fins 352 includes forming a quantity of the plurality of channel fins 352 to satisfy a photocurrent parameter for the pixel sensor 300. In a second implementation, alone or in combination with the first implementation, forming the plurality of channel fins 352 includes forming each of the plurality of channel fins 352 to a particular width 356 to satisfy a photocurrent parameter for the pixel sensor 300. In a third implementation, alone or in combination with one or more of the first and second implementations, forming the transfer gate 314 includes forming the transfer gate 314 to a particular length 354 to satisfy a switching speed parameter for the pixel sensor 300.

In a fourth implementation, alone or in combination with one or more of the first through third implementations, process 900 includes forming the plurality of isolation regions 360 at least partially between the plurality of channel fins 352, and forming the transfer gate 314 includes forming the transfer gate 314 above the plurality of isolation regions 360. In a fifth implementation, alone or in combination with one or more of the first through fourth implementations, process 900 includes forming the oxide layer 502 over the plurality of channel fins 352 and over the plurality of isolation regions 360, etching the oxide layer 502 to form the first buffer oxide region 358a and the second buffer oxide region 358b, and forming the transfer gate 314 between the first buffer oxide region 358a and the second buffer oxide region 358b. In a sixth implementation, alone or in combination with one or more of the first through fifth implementations, process 900 includes forming a first deep n-type region 306c of the photodiode 304, forming a second deep n-type region 306b, of the photodiode 304, over the first deep n-type region 306c, and forming a p-type region 308, of the photodiode 304, over the n-type region 306a, where forming the n-type region 306a includes forming the n-type region 306a over the second deep n-type region 306b.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a pixel sensor includes a transfer finFET to transfer a photocurrent from a photodiode to a drain region. The transfer finFET includes at least a portion of the photodiode, an extension region associated with the drain region, a plurality of channel fins, and a transfer gate at least partially surrounding the channel fins to control the operation of the transfer finFET. In the transfer finFET, the transfer gate is wrapped around (e.g., at least three sides of) each of the channel fins, which provides a greater surface area over which the transfer gate is enabled to control the transfer of electrons. The greater surface area results in greater control over operation of the finFET, which may reduce switching times of the pixel sensor (which enables faster pixel sensor performance) and may reduce leakage current of the pixel sensor relative to a planar transfer transistor.

As described in greater detail above, some implementations described herein provide a pixel sensor. The pixel sensor includes a photodiode including an n-type region. The pixel sensor includes a transfer finFET, configured to transfer a photocurrent from the photodiode to a drain region of the pixel sensor, including at least a portion of the n-type region, a drain extension region coupled to the drain region, a plurality of channel fins coupling the n-type region and the drain extension region, and a transfer gate at least partially surrounding the plurality of channel fins.

As described in greater detail above, some implementations described herein provide a method. The method includes forming, in a substrate of a pixel sensor, a plurality of channel fins for a transfer finFET included in the pixel sensor. The method includes forming, in the substrate, an n-type region of a photodiode included in the pixel sensor. The method includes forming, in the substrate, a drain extension region of the transfer finFET, where the plurality of channel fins couple the n-type region and the drain extension region. The method includes forming, in the substrate, a drain region coupled to the drain extension region. The method includes forming a transfer gate at least partially around the plurality of channel fins. The method includes connecting the drain region to a first interconnect. The method includes connecting the transfer gate to a second interconnect.

As described in greater detail above, some implementations described herein provide a pixel sensor. The pixel sensor includes a substrate. The pixel sensor includes a plurality of channel fins in the substrate. The pixel sensor includes an n-type region coupled to the plurality of channel fins at a first side of the plurality of channel fins. The pixel sensor includes a drain extension region coupled to the plurality of channel fins at a second side of the plurality of channel fins opposing the first side. The pixel sensor includes a drain region coupled to the drain extension region. The pixel sensor includes a p-type region below the plurality of channel fins. The pixel sensor includes a transfer gate above the p-type region and surrounding at least three sides of the plurality of channel fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pixel sensor, comprising:
forming, in a substrate, a cell p-well (CPW) region;
forming, in the substrate, a p-type region;
forming, in the substrate and above the p-type region, a plurality of channel fins for a transfer fin field effect transistor (finFET);
forming, in the substrate and within a perimeter of the CPW region, an n-type region of a photodiode;
forming, in the substrate and within the perimeter of the CPW region, a drain extension region of the transfer finFET,
wherein the plurality of channel fins couple the n-type region and the drain extension region;
forming a transfer gate above the p-type region and at least partially around the plurality of channel fins;
etching the CPW region to form an isolation structure that surrounds the n-type region, the p-type region, the drain extension region, and the transfer gate; and
connecting the transfer gate to an interconnect.

2. The method of claim 1, wherein the transfer gate includes a work function layer.

3. The method of claim 1, wherein forming the transfer gate comprises:
forming a bottom interface oxide layer.

4. The method of claim 3, wherein forming the transfer gate further comprises:
forming a high-k dielectric layer over the bottom interface oxide layer.

5. The method of claim 4, wherein forming the transfer gate further comprises:
forming a work function layer over the high-k dielectric layer.

6. A method of forming a pixel sensor, comprising:
forming, in a substrate, a cell p-well (CPW) region;
forming, in the substrate, a p-type region;
forming, in the substrate and above the p-type region, a plurality of channel fins for a transfer fin field effect transistor (finFET);
forming, in the substrate and within a perimeter of the CPW region, an n-type region of a photodiode;
forming, in the substrate and within the perimeter of the CPW region, a drain extension region of the transfer finFET,
wherein the plurality of channel fins couple the n-type region and the drain extension region;
forming a transfer gate above the p-type region and at least partially around the plurality of channel fins,
wherein the transfer gate comprises a high-k dielectric layer over a bottom interface oxide layer; and
etching the CPW region to form an isolation structure that surrounds the n-type region, the p-type region, the drain extension region, and the transfer gate.

7. The method of claim 6, wherein forming the transfer gate comprises:
forming a titanium nitride (TiN) layer over the high-k dielectric layer.

8. A method of forming a pixel sensor, comprising:
forming, in a substrate, a cell p-well (CPW) region;
forming, in the substrate, a p-type region;
forming, in the substrate and above the p-type region, a plurality of channel fins for a transfer fin field effect transistor (finFET);
forming, in the substrate and within a perimeter of the CPW region, a drain region;
forming, in the substrate and within the perimeter of the CPW region, an n-type region of a photodiode;
forming, in the substrate and within the perimeter of the CPW region, a drain extension region of the transfer finFET,
wherein the plurality of channel fins couple the n-type region and the drain extension region;
forming a transfer gate above the p-type region and at least partially around the plurality of channel fins;
etching the CPW region to form an isolation structure that surrounds the n-type region, the p-type region, the drain extension region, the drain region, and the transfer gate;
connecting the drain region to a first interconnect; and
connecting the transfer gate to a second interconnect.

9. The method of claim 8, further comprising:
forming a plurality of isolation regions at least partially between the plurality of channel fins; and
wherein forming the transfer gate comprises:
forming the transfer gate above the plurality of isolation regions.

10. The method of claim 9, further comprising:
forming an oxide layer over the plurality of channel fins and over the plurality of isolation regions; and
etching the oxide layer to form a first buffer oxide region and a second buffer oxide region; and
wherein forming the transfer gate further comprises:
forming the transfer gate between the first buffer oxide region and the second buffer oxide region.

11. The method of claim 8, further comprising:
forming a first deep n-type region of the photodiode;
forming a second deep n-type region, of the photodiode, over the first deep n-type region; and
forming another p-type region, of the photodiode, over the n-type region; and
wherein forming the n-type region comprises:
  forming the n-type region over the second deep n-type region.

12. The method of claim 8, wherein forming the transfer gate above the p-type region comprises:
forming a titanium nitride (TiN) layer over the p-type region.

13. The method of claim 12, wherein forming the transfer gate above the p-type region further comprises:
forming a tantalum nitride (TaN) layer over the TiN layer.

14. The method of claim 13, wherein forming the transfer gate above the p-type region further comprises:
forming another TiN layer over the TaN layer.

15. The method of claim 14, wherein forming the transfer gate above the p-type region further comprises:
forming a titanium aluminum (TiAl) layer over the other TiN layer.

16. The method of claim 15, wherein forming the transfer gate above the p-type region further comprises:
forming a tungsten layer over the TiAl layer.

17. The method of claim 8, further comprising:
forming a poly oxide layer over the plurality of channel fins.

18. The method of claim 8, further comprising:
forming another p-type region over the n-type region.

19. The method of claim 8, further comprising:
lining the isolation structure with a field implant (FIL) layer.

20. The method of claim 19, further comprising:
depositing an oxide layer over the FIL layer.

* * * * *